(12) United States Patent
Oda et al.

(10) Patent No.: US 10,790,236 B2
(45) Date of Patent: Sep. 29, 2020

(54) WIRING SUBSTRATE AND ELECTRONIC DEVICE

(71) Applicant: SHINKO ELECTRIC INDUSTRIES CO., LTD., Nagano-shi, Nagano-ken (JP)

(72) Inventors: Sachiko Oda, Nagano (JP); Daisuke Takizawa, Tempe, AZ (US); Yu Karasawa, Nagano (JP); Hiroaki Taniguchi, Nagano (JP)

(73) Assignee: SHINKO ELECTRIC INDUSTRIES CO., LTD. (JP)

( * ) Notice: Subject to any disclaimer, the term of this patent is extended or adjusted under 35 U.S.C. 154(b) by 0 days.

(21) Appl. No.: 16/371,258

(22) Filed: Apr. 1, 2019

(65) Prior Publication Data
US 2019/0311990 A1 Oct. 10, 2019

(30) Foreign Application Priority Data

Apr. 5, 2018 (JP) .................................. 2018-073344
Apr. 25, 2018 (JP) .................................. 2018-084221

(51) Int. Cl.
*H01L 23/538* (2006.01)
*H01L 23/498* (2006.01)

(52) U.S. Cl.
CPC .... *H01L 23/5389* (2013.01); *H01L 23/49827* (2013.01); *H01L 23/5384* (2013.01); *H01L 2224/05551* (2013.01); *H01L 2224/05557* (2013.01)

(58) Field of Classification Search
CPC ........................ H01L 23/5389; H01L 23/5384
USPC ......... 438/612, 666, 672, 675; 257/735–737, 257/779–781, 786
See application file for complete search history.

(56) References Cited

U.S. PATENT DOCUMENTS

| | | | | |
|---|---|---|---|---|
| 5,121,299 | A * | 6/1992 | Frankeny | H01L 23/49816 174/261 |
| 7,847,412 | B2 * | 12/2010 | Trezza | H01L 21/6835 257/621 |
| 9,478,498 | B2 * | 10/2016 | Lin | H01L 25/50 |
| 10,290,570 | B2 * | 5/2019 | Arai | H05K 1/112 |
| 2013/0328209 | A1 * | 12/2013 | Selvanayagam | H01L 24/13 257/774 |

FOREIGN PATENT DOCUMENTS

JP 2015146384 A 8/2015

* cited by examiner

*Primary Examiner* — Calvin Lee
(74) *Attorney, Agent, or Firm* — Tarolli, Sundheim, Covell & Tummino LLP

(57) ABSTRACT

A wiring substrate includes a first substrate including a wiring layer and a solder resist layer that partially covers the wiring layer. The solder resist layer includes a circular opening partially exposing the wiring layer and a support partially covering the wiring layer within the opening. The wiring layer includes a first connection pad exposed in the opening and formed by a portion of the wiring layer located at an outer side of the support. The wiring substrate further includes a cylindrical connection pin and a bonding member that bonds a first end surface of the connection pin and the first connection pad located in the opening.

10 Claims, 18 Drawing Sheets

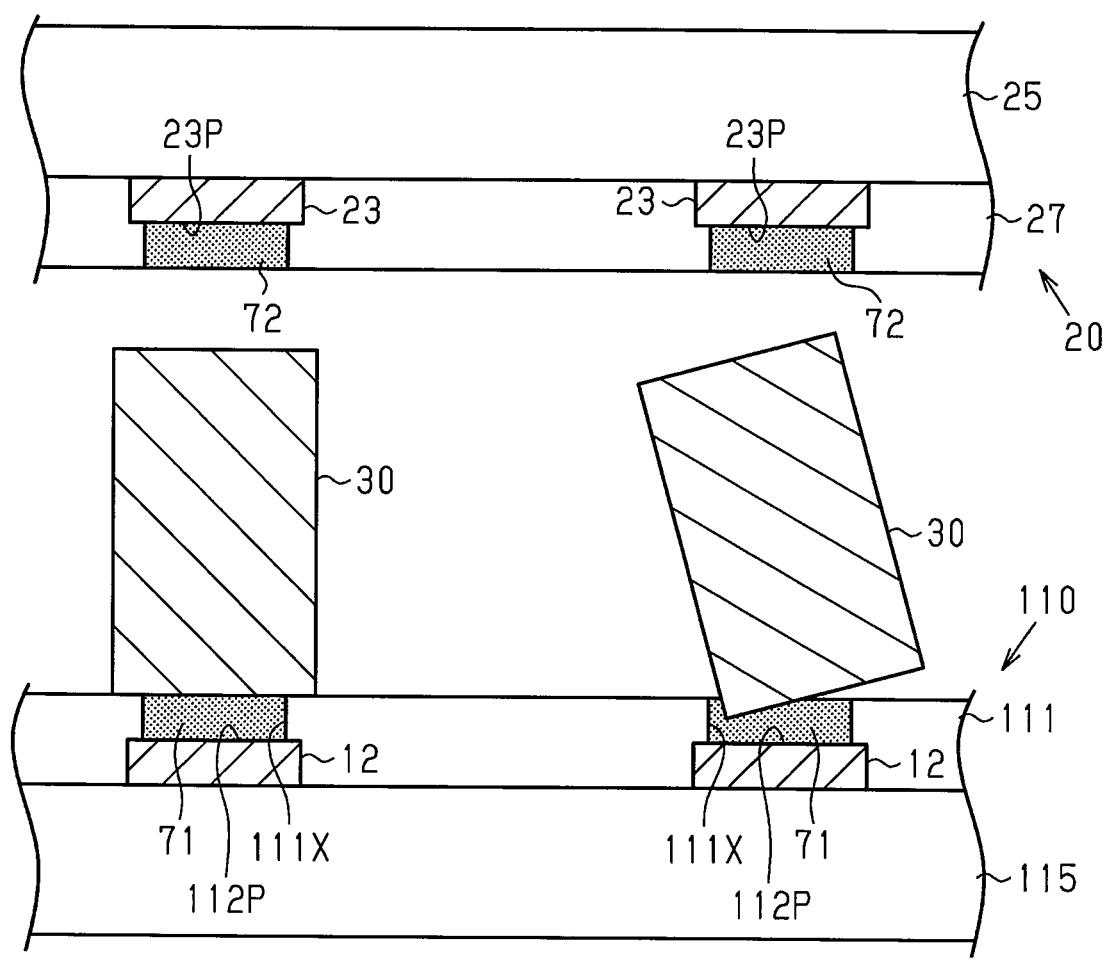
Fig.4 (Comparative Example)

WIRING SUBSTRATE AND ELECTRONIC DEVICE

CROSS-REFERENCE TO RELATED APPLICATIONS

This application is based upon and claims the benefit of priority from prior Japanese Patent Applications No. 2018-073344, filed on Apr. 5, 2018 and No. 2018-084221, filed on Apr. 25, 2018, the entire contents of which are incorporated herein by reference.

FIELD

This disclosure relates to a wiring substrate and an electronic device.

BACKGROUND

A stacked semiconductor device in which an upper semiconductor package is stacked on a lower semiconductor package is known. In the stacked semiconductor device, metal posts or pins are used to connect the upper semiconductor package to the lower semiconductor package (Japanese Laid-Open Patent Publication No. 2015-146384).

In such a stacked semiconductor device, if misalignment of a metal pin occurs, the metal pin may be inclined with respect to a lower wiring substrate. In this case, it is difficult to connect the metal pin to a connection pad of an upper wiring substrate. This hinders reliable connection of the upper wiring substrate and the lower wiring substrate with the metal pin and decreases manufacturing yield.

SUMMARY

One embodiment is a wiring substrate including a first substrate including a wiring layer and a solder resist layer that partially covers the wiring layer. The solder resist layer includes a circular opening partially exposing the wiring layer and a support partially covering the wiring layer within the opening. The wiring layer includes a first connection pad exposed in the opening and formed by a portion of the wiring layer located at an outer side of the support. The wiring substrate further includes a cylindrical connection pin and a bonding member that bonds a first end surface of the connection pin and the first connection pad located in the opening.

Another embodiment is an electronic component including a first substrate, a second substrate, an electronic component, a connection pin, a first bonding member, a second bonding member, and an encapsulation resin. The first substrate includes a wiring layer and a solder resist layer that partially covers the wiring layer. The solder resist layer includes an opening and a support. The opening is circular and partially exposes the wiring layer. The support partially covers the wiring layer within the opening. The wiring layer includes a first connection pad exposed in the opening and formed by a portion of the wiring layer located at an outer side of the support. The second substrate includes a second connection pad. The electronic component is mounted to or embedded in at least one of the first substrate and the second substrate. The connection pin is cylindrical and arranged between the first substrate and the second substrate. The first bonding member bonds a first end surface of the connection pin and the first connection pad located in the opening. The second bonding member bonds a second end surface of the connection pin and the second connection pad. A gap between the first substrate and the second substrate is filled with the encapsulation resin to encapsulate the electronic component and the connection pin.

Another embodiment of a wiring substrate includes a first substrate, a connection pin, and a bonding member. The first substrate includes a wiring layer and a solder resist layer that partially covers the wiring layer. The solder resist layer includes an opening that is triangular. The triangular opening exposes a portion of the wiring layer as a first connection pad. The connection pin is cylindrical and arranged so that a portion of a first end surface of the connection pin overlaps the solder resist layer in a plan view and so that a remaining portion of the first end surface overlaps the opening in a plan view. The bonding member bonds the first end surface of the connection pin and the first connection pad located in the opening.

Another embodiment of an electronic component includes a first substrate, a second substrate, an electronic component, a connection pin, a first bonding member, a second bonding member, and an encapsulation resin. The first substrate includes a wiring layer and a solder resist layer that partially covers the wiring layer. The solder resist layer includes an opening that is triangular. The triangular opening exposes a portion of the wiring layer as a first connection pad. The second substrate includes a second connection pad. The electronic component is mounted to or embedded in at least one of the first substrate and the second substrate. The connection pin is cylindrical and arranged between the first substrate and the second substrate. The connection pin is arranged so that a portion of a first end surface of the connection pin overlaps the solder resist layer in a plan view and so that a remaining portion of the first end surface overlaps the opening in a plan view. The first bonding member bonds the first end surface of the connection pin and the first connection pad located in the opening. The second bonding member bonds a second end surface of the connection pin and the second connection pad. A gap between the first substrate and the second substrate is filled with the encapsulation resin to encapsulate the electronic component and the connection pin.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 4 is a partially schematic cross-sectional view of a wiring substrate according to a comparison example and illustrates inclination of a connection pin;

DESCRIPTION OF THE EMBODIMENTS

Figure 1:
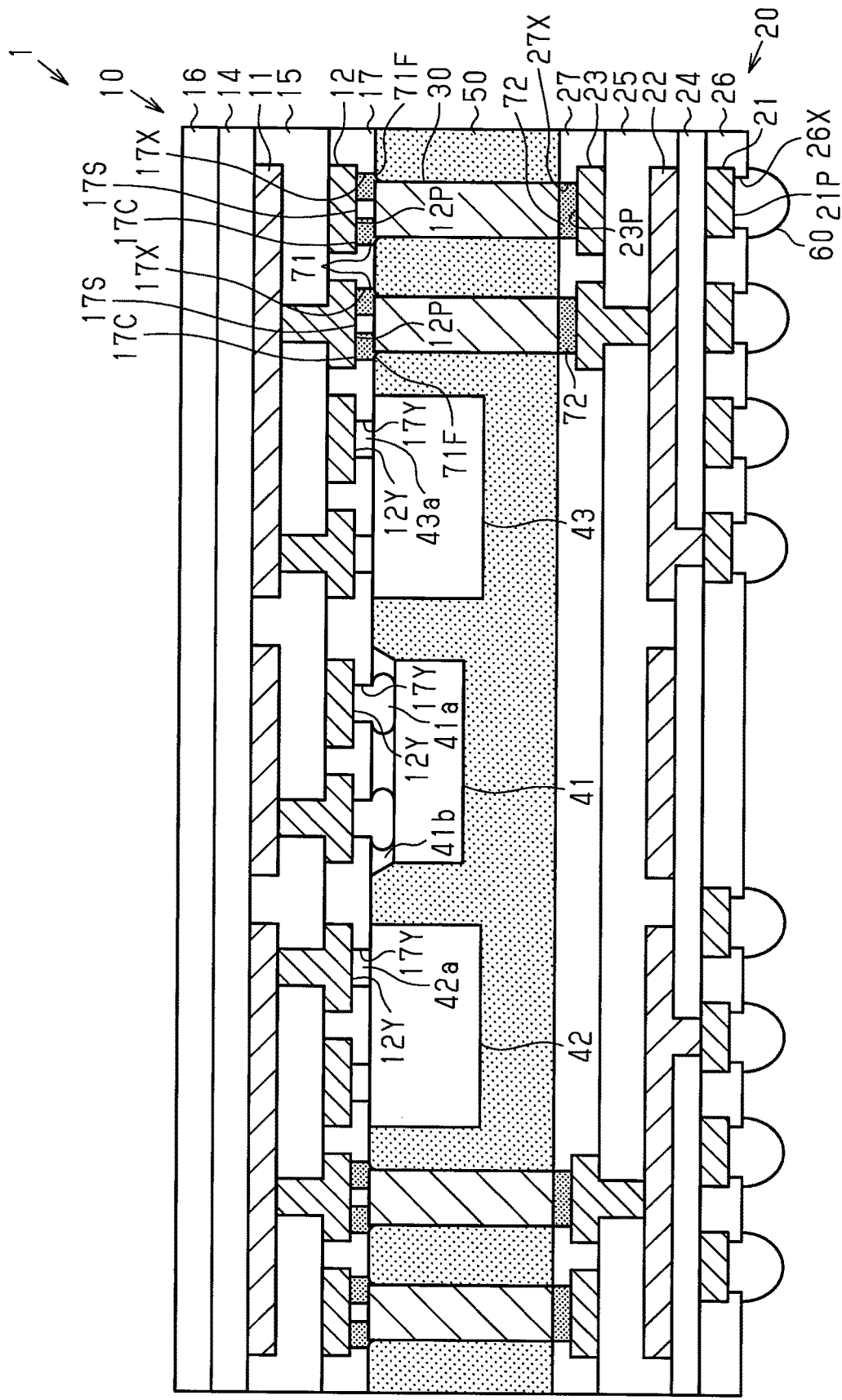
FIG. 1 is a schematic cross-sectional view of a wiring substrate according to a first embodiment.

Various embodiments will now be described with reference to the accompanying drawings. Elements in the drawings may be partially enlarged for simplicity and clarity and thus have not necessarily been drawn to scale. To facilitate understanding, hatching lines may not be illustrated in the cross-sectional drawings. In the description hereafter, the "plan view" refers to the view of an object taken in the vertical direction (for example, upper-lower direction in FIG. 1), and the "planar shape" refers to the shape of an object viewed in the vertical direction.

First Embodiment

A wiring substrate 1 according to a first embodiment will now be described with reference to FIGS. 1 to 13.

As illustrated in FIG. 1, the wiring substrate 1 includes a first substrate 10, a second substrate 20, connection pins 30, electronic components 41, 42, and 43, and an encapsulation resin 50. As a non-limiting example, the wiring substrate 1 is configured as an electronic device including the electronic components 41, 42, and 43 together with the first and second substrates 10 and 20.

The first substrate 10 is connected to the second substrate 20 by the connection pins 30. The connection pins 30 are conductive columnar metal pins. For example, the connection pins 30 are each cylindrical. In the present example, the electronic components 41 to 43 are mounted to the lower surface of the first substrate 10. A gap between the first substrate 10 and the second substrate 20 is filled with the encapsulation resin 50 to encapsulate the connection pins 30 and the electronic components 41-43. External connection terminals 60 are formed on the lower surface of the second substrate 20. The external connection terminals 60 are used for connection to electrodes of a mounting substrate such as a mother board on which the wiring substrate is mounted.

The second substrate 20 includes wiring layers 21, 22, and 23, insulation layers 24 and 25, and solder resist layers 26 and 27. The wiring layer 21 is formed on the lower surface of the insulation layer 24. The wiring layer 22 is formed on the upper surface of the insulation layer 24. The wiring layer 22 includes via wirings extending through the insulation layer 24 in a thickness-wise direction and wiring patterns connected to the wiring layer 21 by the via wirings. The insulation layer 25 is formed on the upper surface of the insulation layer 24 and covers the wiring layer 22. The wiring layer 23 is formed on the upper surface of the insulation layer 25. The wiring layer 23 includes via wirings extending through the insulation layer 25 in a thickness-wise direction and wiring patterns connected to the wiring layer 22 by the via wirings. For example, copper (Cu) or a copper alloy may be used as the material of the wiring layers 21 to 23. The material of the insulation layers 24 and 25 may be, for example, an organic resin such as an epoxy resin or a polyimide resin or a resin material in which the organic resin is mixed with filler such as silica or alumina.

The solder resist layer 26 covers the lower surface of the insulation layer 24 and part of the wiring layer 21. The solder resist layer 26 includes openings 26X that expose portions of the lower surface of the wiring layer 21 as external connection pads 21P. The material of the solder resist layer 26 may be, for example, an insulative resin such as an epoxy resin or an acrylic resin.

The external connection terminals 60 are connected to the external connection pads 21P. The external connection terminals 60 are, for example, solder bumps. The external connection terminals 60 may be solder balls, lead pins, or the like.

If necessary, an Organic Solderability Preservative (OSP) process may be performed to form an OSP film on the surface of the wiring layer 21 exposed in the openings 26X of the solder resist layer 26. In this case, the external connection terminals 60 may be connected to the OSP film. Alternatively, a metal layer may be formed on the wiring layer 21 exposed in the openings 26X. In this case, the external connection terminals 60 may be connected to the metal layer. Examples of the metal layer include an Au layer, an Ni layer/Au layer (metal layer in which the Ni layer serves as the bottom layer, and the Ni layer and the Au layer are sequentially stacked), or an Ni layer/Pd layer/Au layer (metal layer in which the Ni layer serves as the bottom layer, and the Ni layer, the Pd layer, and the Au layer are sequentially stacked). Portions of the wiring layer 21 exposed in the openings 26X, or the metal layer or the OSP film formed on the wiring layer 21, may be used as the external connection terminals 60.

The solder resist layer 27 covers the upper surface of the insulation layer 25 and part of the wiring layer 23. The solder resist layer 27 includes openings 27X that expose portions of the upper surface of the wiring layer 23 as connection pads 23P. The openings 27X are each, circular in a plan view. Each opening 27X has an inner size (diameter) that is set according to an outer size (diameter) of each connection pin 30. For example, the opening 27X has the same diameter as that of the connection pin 30. The material of the solder resist layer 27 may be, for example, an insulative resin such as an epoxy resin or an acrylic resin.

If necessary, an OSP process may be performed to form an OSP film on the surface of the wiring layer 23 exposed in the openings 27X of the solder resist layer 27. Alternatively, a metal layer may be formed on the wiring layer 23 exposed in the openings 27X. Examples of the metal layer include an Au layer, an Ni layer/Au layer (metal layer in which the Ni layer serves as the bottom layer, and the Ni layer and the Au layer are sequentially stacked), or an Ni layer/Pd layer/Au layer (metal layer in which the Ni layer serves as the bottom layer, and the Ni layer, the Pd layer, and the Au layer are sequentially stacked). Portions of the wiring layer 23 exposed in the openings 27X, or the metal layer or the OSP film formed on the wiring layer 23, may be used as the connection pads 23P.

The first substrate 10 includes wiring layers 11 and 12, insulation layers 14 and 15, a protection insulation layer 16, and a solder resist layer 17. The wiring layer 11 is formed on the lower surface of the insulation layer 14. The insulation layer 15 is formed on the lower surface of the insulation layer 14 and covers the wiring layer 11. The wiring layer 12 is formed on the lower surface of the insulation layer 15. The wiring layer 12 includes via wirings extending through the insulation layer 15 in the thickness-wise direction and wiring patterns connected to the wiring layer 11 by the via wirings. For example, copper (Cu) or a copper alloy may be used as the material of the wiring layers 11 and 12. The material of the insulation layers 14 and 15 may be, for example, an organic resin such as an epoxy resin or a polyimide resin or a resin material in which the organic resin is mixed with filler such as silica or alumina.

The protection insulation layer 16 covers the upper surface of the insulation layer 14. The material of the protection insulation layer 16 may be, for example, an insulative resin such as an epoxy resin or an acrylic resin.

Figure 2A:
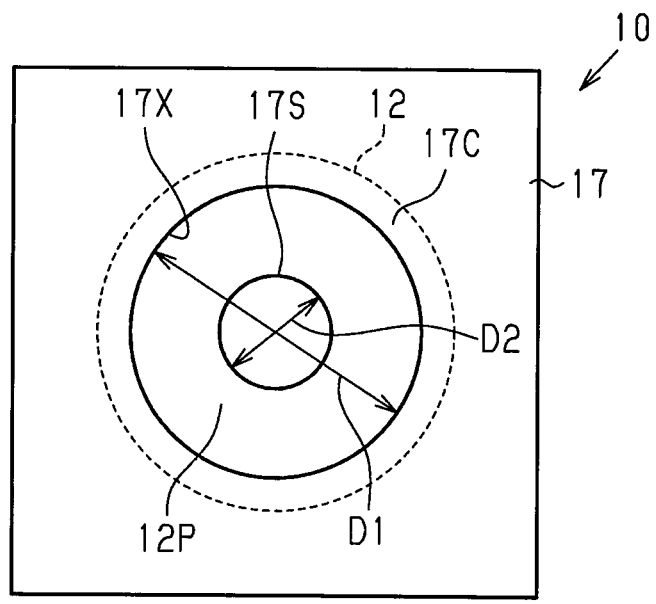
FIG. 2A is a partially schematic plan view illustrating a solder resist layer arranged in the wiring substrate of FIG. 1 and including an opening and a support.
Figure 2B:
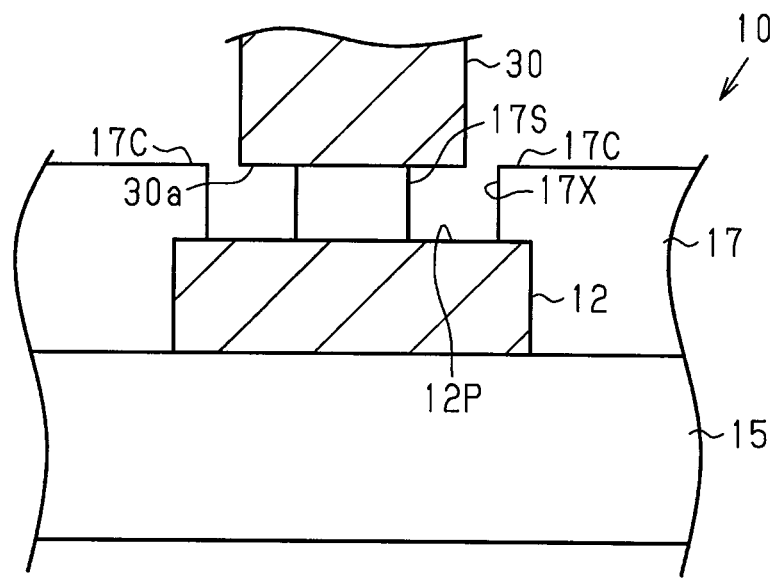
FIG. 2B is a partially schematic cross-sectional view illustrating a connection pin and the solder resist layer covering a wiring layer.

As illustrated in FIGS. 1, 2A, and 2B, the solder resist layer 17 includes openings 17X, which expose portions of the wiring layer 12 as connection pads 12P, and openings 17Y, which expose other portions of the wiring layer 12 as pads 12Y. FIG. 2B illustrates part of the structure of the first substrate 10 that is inverted upside down. The pads 12Y are used for connection to the electronic components 41 to 43 and the connection pads 12P are used for connection to the connection pins 30. The material of the solder resist layer 17 may be, for example, an insulative resin such as an epoxy resin or an acrylic resin.

As illustrated in FIG. 2A, the openings 17X are each, circular in a plan view. Each opening 17X has an inner size (diameter) that is set according to the outer size (diameter) of each connection pin 30. As illustrated in FIG. 2B, for example, the opening 17X has a diameter that is larger than that of the connection pin 30.

As illustrated in FIGS. 1, 2A, and 2B, the solder resist layer 17 includes supports 17S arranged in the openings 17X. In the present example, each of the supports 17S is arranged in one of the openings 17X. Thus, a single support 17S is arranged in each opening 17X (refer to FIG. 2B). The solder resist layer 17 also includes a covering portion 17C defining a wall of each opening 17X and covering an outer circumference of the surface (upper surface in FIG. 2B) of the wiring layer 12 exposed in the opening 17X. The support 17S has a thickness that equals to a height of the opening 17X, that is, a thickness of the covering portion 17C of the solder resist layer 17.

The planar shape of each of the supports 17S is not limited to be circular and may be any other shape. From the viewpoint of suppressing inclination of the connection pins 30 and sufficiently obtaining a bonding area with the solder 71 (refer to FIG. 1), each of the supports 17S is preferably circular in a plan view. In the present example, each of the supports 17S has the same center as the corresponding one of the openings 17X. When the diameter (inner diameter) of each opening 17X is D1 and the diameter (outer diameter) of each support 17S is D2, the diameter D1 is set to a value that is greater than the diameter of the connection pin 30 and the diameter D2 is set to a value that is smaller than the diameter of the connection pin 30. The diameter D2 of the support 17S may be appropriately set according to the diameter D1 of the opening 17X and the diameter of the connection pin 30. Preferably, the diameter D2 of the support 17S be set so that the shortest distance from the side surface of the support 17S to the wall surface of the opening 17X is less than 50% of the diameter of the connection pin 30. Such a setting may suppress inclination of the connection pin 30 even if the connection pin 30 is largely misaligned.

If necessary, an OSP process may be performed to form an OSP film on the surface of the wiring layer 12 exposed in the openings 17X of the solder resist layer 17. Alternatively, a metal layer may be formed on the wiring layer 12 exposed in the openings 17X. Examples of the metal layer include an Au layer, an Ni layer/Au layer (metal layer in which the Ni layer serves as the bottom layer, and the Ni layer and the Au layer are sequentially stacked), or an Ni layer/Pd layer/Au layer (metal layer in which the Ni layer serves as the bottom layer, and the Ni layer, the Pd layer, and the Au layer are sequentially stacked). Portions of the wiring layer 12 exposed in the openings 17X, or the metal layer or the OSP film formed on the wiring layer 12, may be used as the connection pads 12P.

Referring to FIG. 1, the electronic components 41 to 43 are mounted on the lower surface of the first substrate 10. The electronic component 41 is, for example, a semiconductor device. The electronic component 41 is connected to the pads 12Y of the first substrate 10 by solder 41a. A gap between the electronic component 41 and the first substrate 10 is filled with an underfill resin 41b. The electronic components 42 and 43 are, for example, capacitor elements. The electronic components 42 and 43 are respectively connected to the pads 12Y of the first substrate 10 by solder 42a and 43a.

The connection pads 12P of the first substrate 10 are connected to the connection pads 23P of the second substrate 20 by the connection pins 30 and solder 71 and 72 (bonding member). The connection pins 30 each include a first end portion (upper end portion in FIG. 1) and a second end portion (lower end portion in FIG. 1). The first end portion of each of the connection pins 30 is connected to one of the connection pads 12P of the first substrate 10 by the solder 71 arranged in the corresponding opening 17X of the solder resist layer 17. The second end portion of each of the connection pins 30 is connected to one of the connection pads 23P of the second substrate 20 by the solder 72 arranged in the corresponding opening 27X of the solder resist layer 27. As described above, in the solder resist layer 17 of the first substrate 10, the supports 17S in the openings 17X have the same thickness as that of the covering portions 17C. Thus, as illustrated in FIG. 2B, a first end surface 30a of each connection pin 30 is in contact with the corresponding support 17S.

As the material of the connection pins 30, for example, a metal such as copper, aluminum, or the like, or an alloy including at least one of those metals may be used.

As the encapsulation resin 50, for example, an insulative resin such as an epoxy resin or a polyimide resin or a resin material in which the insulative resin is mixed with filler such as silica or alumina may be used.

Here, a comparative example will now be described. The description of the comparative example is based on the personal study by the inventors and may include technical contents which are not known in the art. In the following description of the comparative example, the same reference characters are given to those members that are the same as the corresponding members of the wiring substrate 1 of the first embodiment.

FIG. 4 is a partially schematic cross-sectional view of a wiring substrate according to the comparison example and illustrates part of the structure of the comparison example that is inverted upside down with respect to the structure of FIG. 1. The wiring substrate of the comparison example includes a first substrate 110, the second substrate 20, and the connection pins 30. FIG. 4 illustrates a step of connecting the second substrate 20 to the connection pins 30 connected to the first substrate 110.

The first substrate 110 includes a solder resist layer 111. The solder resist layer 111 includes openings 111X that are circular in a plan view and expose portions of the wiring layer 12 as connection pads 112P. The openings 111X each have a diameter (inner diameter) that is smaller than the outer diameter of each of the connection pins 30. Each of the connection pins 30 is connected to one of the connection pads 112P by solder 71 arranged in the corresponding opening 111X.

As illustrated in FIG. 4, one of the connection pins 30 is misaligned rightward from the center of the corresponding opening 111X, and part of the lower end of the misaligned connection pin 30 falls into the opening 111X. As a result, the misaligned connection pin 30 is inclined and connected to the connection pad 112P by the solder 71.

In such a state, the second substrate 20 is connected to the upper ends of the connection pins 30. The solder resist layer 27 of the second substrate 20 includes openings 27X exposing portions of the wiring layer 23 as the connection pads 23P, and the upper ends of the connection pins 30 are connected to the connection pads 23P by the solder 72 arranged in the openings 27X.

In this case, the upper end of the connection pin 30 that is inclined with respect to the first substrate 110 is misaligned from the connection pad 23P of the second substrate 20. Accordingly, the inclined connection pin 30 may not be well bonded to the solder 72. This lowers the connection reliability of the first substrate 110 and the second substrate 20 and decreases the manufacturing yield of the wiring substrate. A smaller diameter of the opening 111X may suppress the connection pin 30 from being inclined and falling into the opening 111X. However, the bonding strength of the connection pin 30 and the solder 71 may not be sufficiently obtained because the amount of solder 71 formed in the opening 111X is decreased.

In view of the above, the wiring substrate 1 of the first embodiment includes the supports 17S that suppresses inclination of the connection pins 30.

Figure 3A:
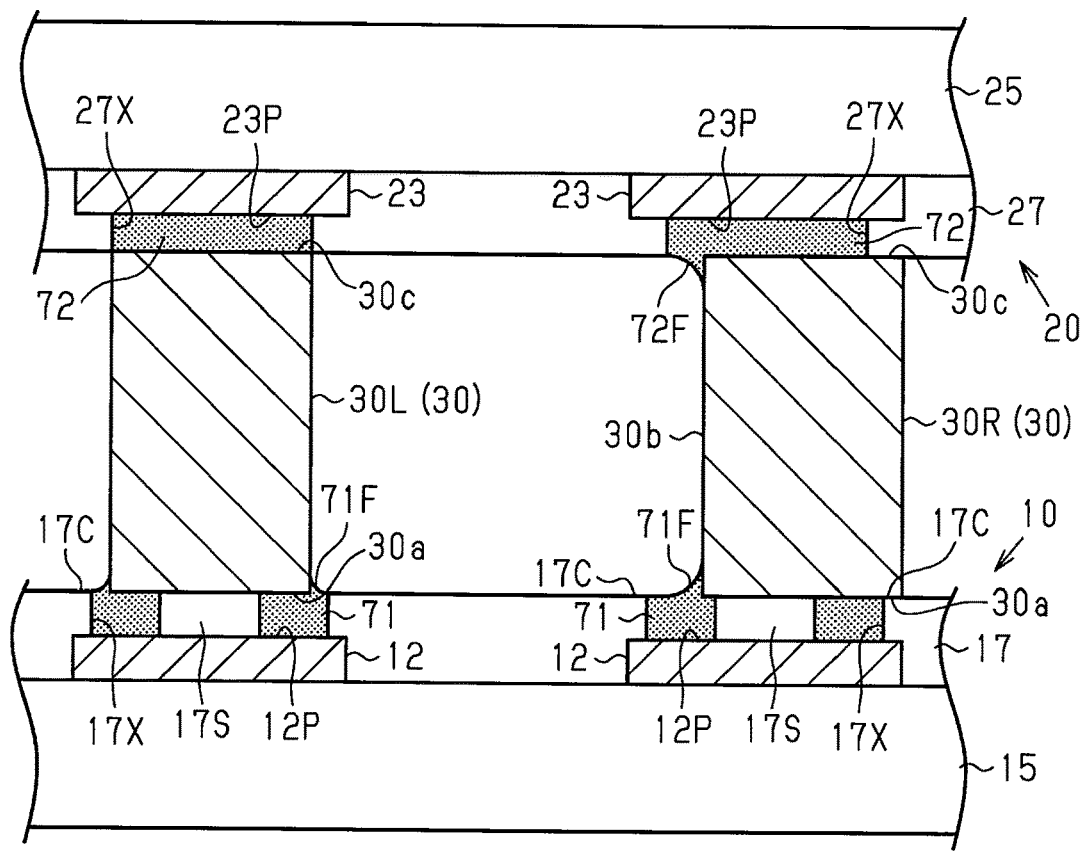
FIG. 3A is a partially schematic cross-sectional view illustrating a connection state of a connection pin that is not misaligned and a connection state of a connection pin that is misaligned.
Figure 3B:
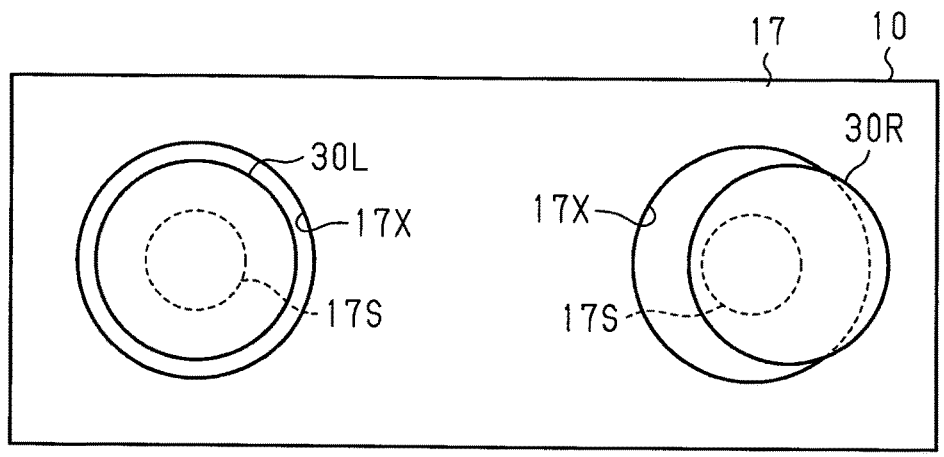
FIG. 3B is a partially schematic plan view of FIG. 3A illustrating the solder resist layer and the connection pins.

FIG. 3A is a partially schematic cross-sectional view illustrating part of the wiring substrate 1 of the first embodiment that is inverted upside down with respect to the structure of FIG. 1. FIG. 3B is a partially schematic plan view of FIG. 3A illustrating the solder resist layer 17 and the connection pins 30.

The solder resist layer 17 of the first substrate 10 includes the openings 17X, each of which partially exposes the wiring layer 12, and the supports 17S, each of which partially covers the wiring layer 12 within the corresponding one of the openings 17X. Each of the connection pads 12P is exposed in the corresponding opening 17X and formed by the portion of the wiring layer 12 located at the outer side of the corresponding support 17S. The first end surfaces 30a of the connection pins 30 are connected to the connection pads 12P by the solder 71 arranged in the openings 17X. In this structure, the supports 17S are in contact with the connection pins 30 and suppress inclination of the connection pins 30. The supports 17S each have the same thickness as that of the covering portions 17C covering the wiring layer 12. Thus, even if the connection pin 30 is misaligned, the support 17S and the covering portion 17C suppress inclination of the connection pin 30.

In FIGS. 3A and 3B, the connection pin 30L (30) that is not misaligned is illustrated on the left side, and the connection pin 30R (30) that is misaligned is illustrated on the right side.

Firstly, the connection pin 30L that is not misaligned will now be described. As illustrated in FIGS. 3A and 3B, the connection pin 30L is located immediately above the opening 17X of the solder resist layer 17 and has the same center as that of the opening 17X. The support 17S arranged in the opening 17X has the same thickness as that of the covering portion 17C covering the wiring layer 12. The connection pin 30L is connected to the connection pad 12P by the solder 71 arranged in the opening 17X, and the first end surface 30a of the connection pin 30L is in contact with the end surface (upper end surface in FIG. 3A) of the support 17S.

The solder 71 bonded to the connection pin 30L includes a fillet 71F bonded to the entire side surface 30b (entire circumference) at the first end portion (lower end portion in FIG. 3A) of the connection pin 30L. The fillet 71F is a bonding portion having a concave-curved surface and increases the contact area of the solder 71 and the connection pin 30L as compared to when only the first end surface 30a of the connection pin 30L is in contact with the solder 71. The increase in the contact area increases the bonding strength with the solder 71.

Next, the connection pin 30R that is misaligned will now be described. As illustrated in FIGS. 3A and 3B, the connection pin 30R is largely misaligned from the center of the opening 17X, for example, by a distance equal to or greater than the radius of the support 17S. In this case, the first end surface 30a of the connection pin 30R is in contact with the end surface (upper end surface in FIG. 3A) of the support 17S arranged in the opening 17X of the solder resist layer 17. The support 17S has the same thickness as that of the covering portion 17C covering the wiring layer 12. Thus, the connection pin 30R is supported by the covering portion 17C and the support 17S and therefore not inclined. Accordingly, the connection pin 30R is reliably connected to the connection pad 12P by the solder 71. In this manner, the arrangement of the support 17S in the opening 17X suppresses inclination of the misaligned connection pin 30R.

The solder 71 bonded to the connection pin 30R includes a fillet 71F bonded to part of the side surface 30b at the first end portion (lower end portion in FIG. 3A) of the connection pin 30R. The fillet 71F is a bonding portion having a concave-curved surface and increases the contact area of the solder 71 and the connection pin 30R as compared to when only the first end surface 30a of the connection pin 30R is in contact with the solder 71. The first end surface 30a of the connection pin 30R overlaps the circumference (i.e., covering portion 17C) of the opening 17X in accordance with the amount of the misalignment. This reduces the area in which the first end surface 30a of the connection pin 30R is bonded to the solder 71 in the opening 17X. Even in this case, the fillet 71F of the solder 71 bonded to the side surface 30b of the connection pin 30R limits the reduction in the contact area of the connection pin 30R and the solder 71. Thus, the bonding strength with the solder 71 is maintained.

Additionally, a second end surface 30c of the misaligned connection pin 30R overlaps the portion of the solder resist layer 27 at the circumference of the opening 27X. The solder 72 bonded to the connection pin 30R includes a fillet 72F bonded to part of the side surface 30b at the second end portion (upper end portion in FIG. 3A) of the connection pin 30R. In the same manner as the fillet 71F, the fillet 72F is a bonding portion having a concave-curved surface and limits the reduction in the contact area of the solder 72 and the connection pin 30R. Thus, the second end surface 30c of the connection pin 30R is rigidly bonded to the solder 72 and reliably connected to the connection pad 23P of the second substrate 20. In the connection pin 30L that is not misaligned, the entire second end surface 30c of the connection pin 30L is connected to the connection pad 23P by the solder 72. Consequently, each of the connection pins 30L and 30R is reliably connected to the connection pads 12P by the solder 71 and to the connection pads 23P by the solder 72. Thus, the decrease in the connection reliability of the first substrate 10 and the second substrate 20 and the decrease in the manufacturing yield are suppressed.

A method for manufacturing the wiring substrate 1 will now be described. To facilitate understanding, portions that ultimately become elements of the wiring substrate 1 are indicated by reference characters used to denote the final elements.

Figure 5:
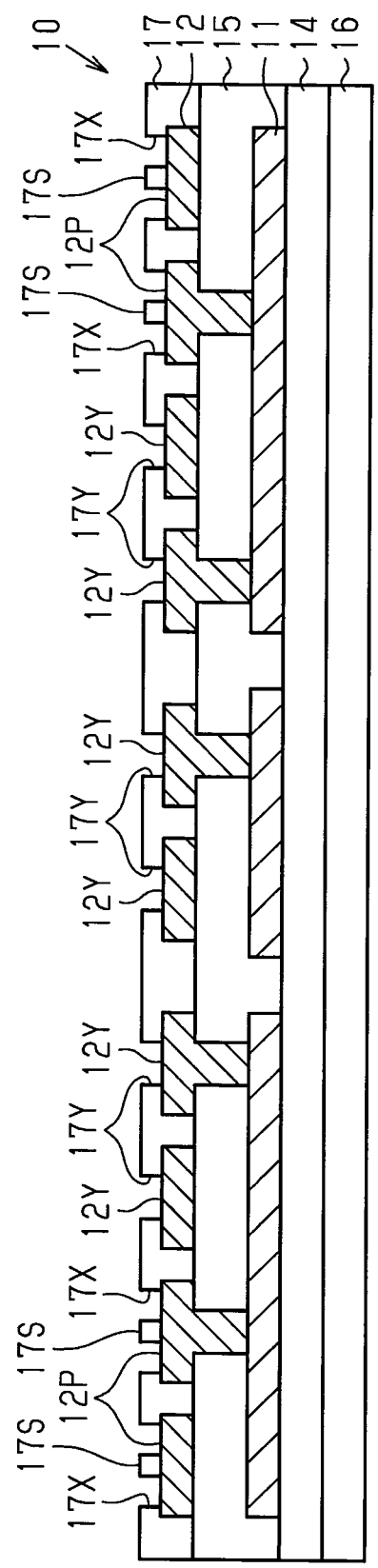
FIGS. 5, 6A to 6C, 7, 8A, 8B, and 9 to 13 are schematic cross-sectional views illustrating a method for manufacturing the wiring substrate of FIG. 1.

As illustrated in FIG. 5, the first substrate 10 is prepared. FIG. 5 illustrates the structure of the first substrate 10 of FIG. 1 that is inverted upside down.

The first substrate 10 may be manufactured by the known method. As described above, the first substrate 10 includes the wiring layers 11 and 12, the insulation layers 14 and 15, the protection insulation layer 16, and the solder resist layer 17. The insulation layers 14 and 15 may be obtained, for example, by laminating with resin films under vacuum and curing the resin films with heat. Alternatively, the insulation layers 14 and 15 may be formed by applying a resin paste or a resin liquid and curing the resin with heat. Next, openings are formed in the insulation layer 15 by the known method. The wiring layers 11 and 12 may be formed, for example, through a semi-additive process. Alternatively, the wiring layers 11 and 12 may be formed by etching a metal foil (for example, copper foil). The protection insulation layer 16 may be obtained, for example, by laminating the insulation layer 14 with a photosensitive solder resist film or applying a liquid solder resist to the insulation layer 14 and then exposing and developing the resist through photolithography to be patterned into a desired shape. Similarly, the solder resist layer 17 may be obtained, for example, by laminating the insulation layer 15 and the wiring layer 12 with a photosensitive solder resist film or applying a liquid solder resist to the insulation layer 15 and the wiring layer 12 and then exposing and developing the resist through photolithography to be patterned into a desired shape.

Figure 6A:
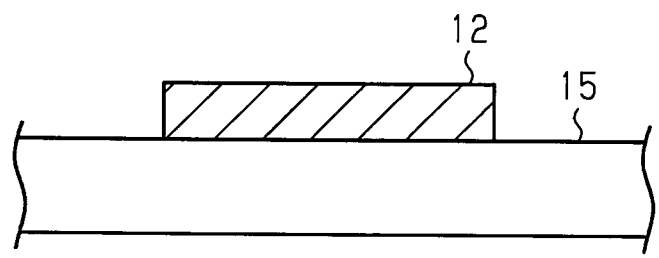
Figure 6B:
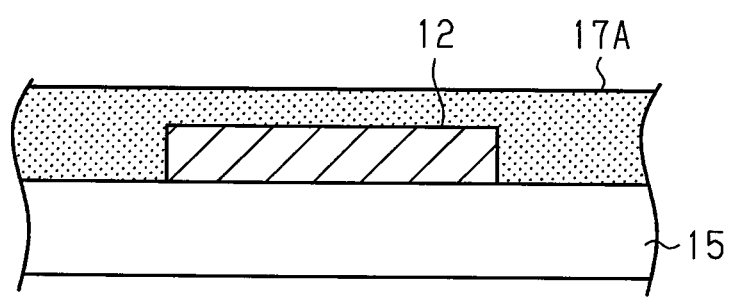
Figure 6C:
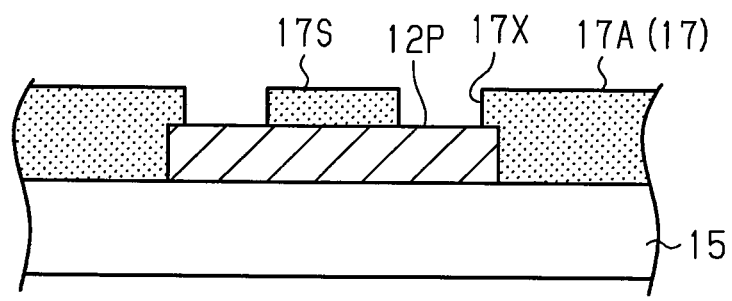

FIGS. 6A to 6C illustrate a step of forming the openings 17X and the supports 17S in the solder resist layer 17.

As illustrated in FIG. 6A, the wiring layer 12 is formed on the upper surface of the insulation layer 15. As illustrated in FIG. 6B, a resin layer 17A is formed covering the upper surface of the insulation layer 15 and the wiring layer 12. The resin layer 17A is formed by, for example, a negative-type photosensitive resin. Alternatively, the resin layer 17A may be formed by a positive-type photosensitive resin. Next, a photomask (not illustrated) including openings at positions corresponding to the openings 17X and the supports 17S is formed. Then, as illustrated in FIG. 6C, the openings 17X and the supports 17S are formed in the resin layer 17A by exposing and developing the resin layer 17A through the openings of the photomask. When the negative-type photosensitive resin is used, the development removes non-exposed portions of the resin layer 17A to form the openings 17X and the supports 17S. When the positive-type photosensitive resin is used, the development removes the exposed portions of the resin layer 17A to form the openings 17X and the supports 17S.

Figure 7:
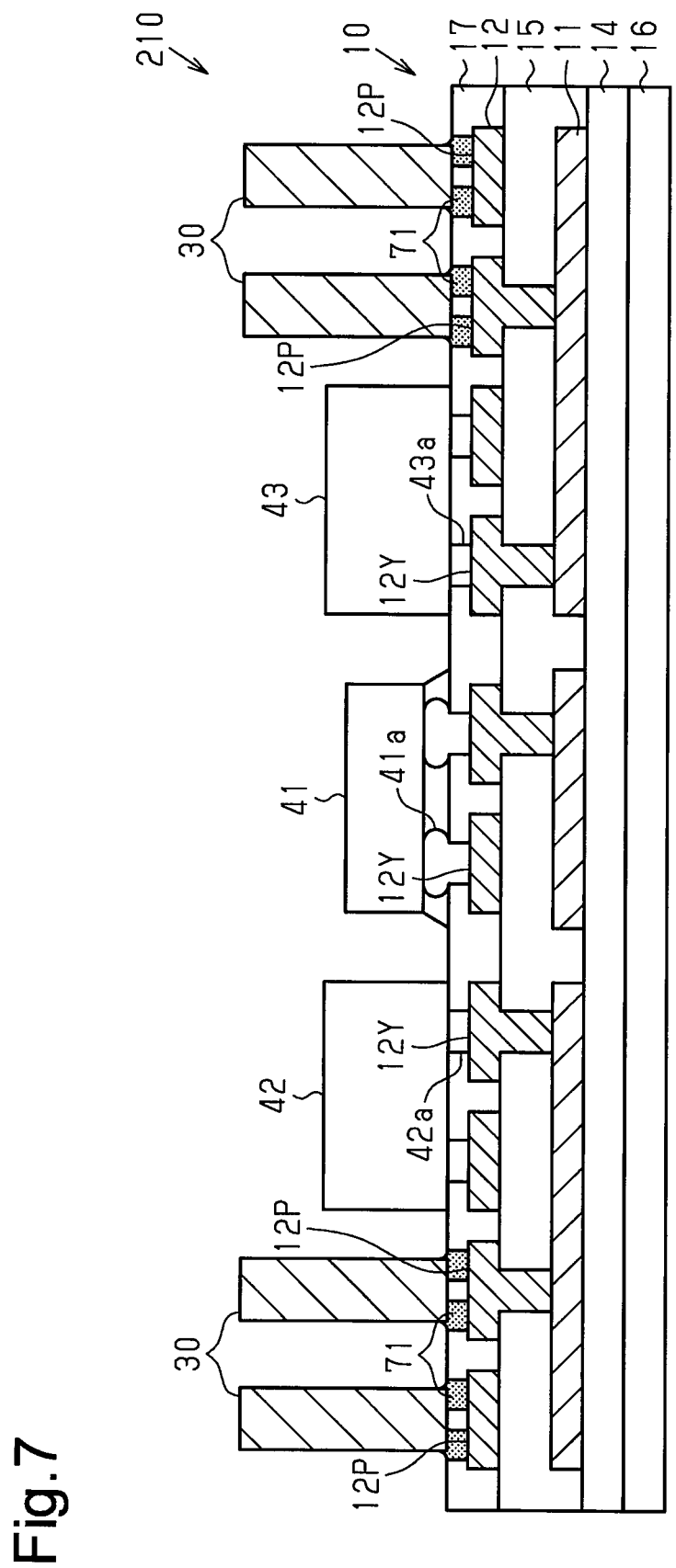

As illustrated in FIG. 7, the lower end surfaces of the connection pins 30 are connected to the connection pads 12P by the solder 71. The connection pins 30 are arranged by using a pin transfer jig 200 illustrated in FIGS. 8A and 8B.

Figure 8A:
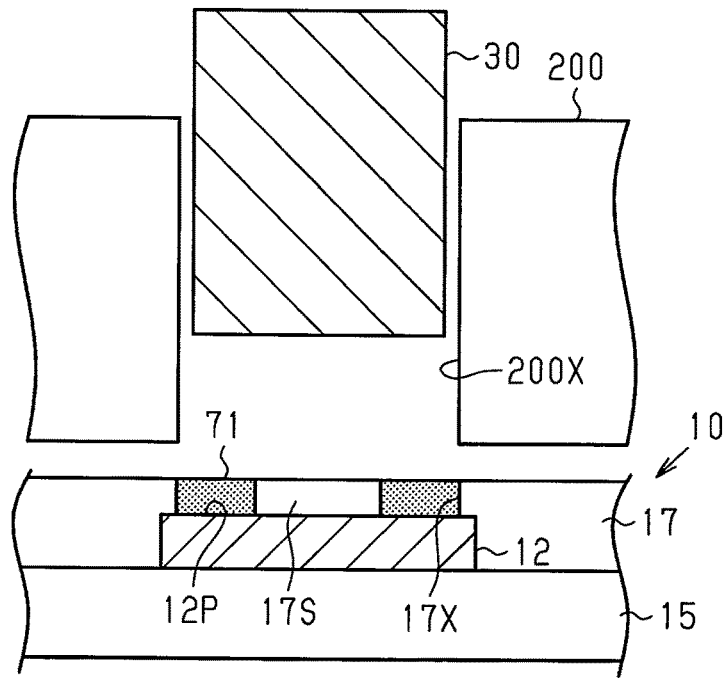

As illustrated in FIG. 8A, a solder paste 71 is applied to the openings 17X of the first substrate 10. Next, the pin transfer jig 200 is prepared. The pin transfer jig 200 has through holes 200X that are formed according to the layout of the connection pads 12P of the first substrate 10.

Next, the through holes 200X of the pin transfer jig 200 are aligned with the openings 17X of the solder resist layer 17 of the first substrate 10 by image-recognizing alignment marks (not illustrated) formed in the solder resist layer 17. Then, the connection pins 30 are inserted into the through holes 200X of the pin transfer jig 200 from above.

Figure 8B:
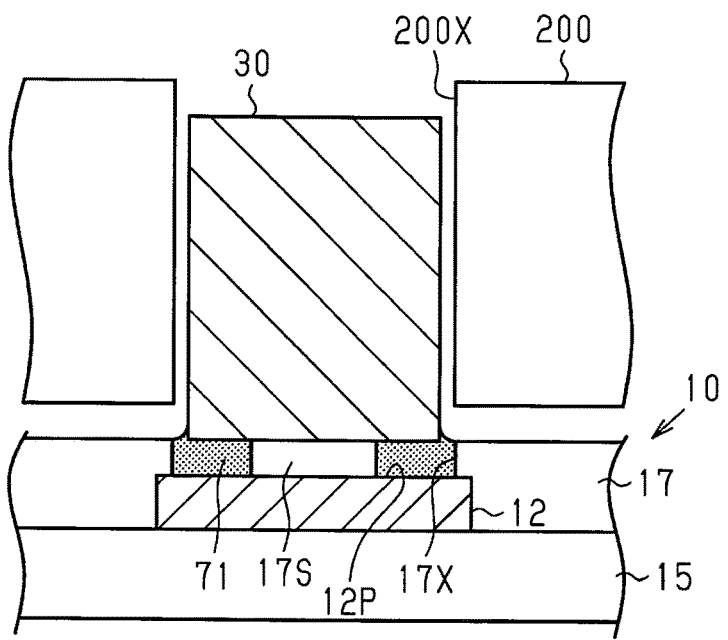

As illustrated in FIG. 8B, the connection pins 30 are filled into the openings 17X of the solder resist layer 17 and the lower end surfaces of the connection pins 30 contact the upper end surfaces of the supports 17S. Further, the lower end surfaces of the connection pins 30 contact the solder paste 71 applied to the openings 17X.

Next, after removal of the pin transfer jig 200, the solder paste 71 is heated through the reflow process. This connects the connection pins 30 to the connection pads 12P with the solder 71 as illustrated in FIG. 7.

Next, as illustrated in FIG. 7, the electronic components 41 to 43 are prepared and connected to the pads 12Y of the first substrate 10 by the solder 41a, 42a, and 43a. Then, the gap between the electronic component 41 and the first substrate 10 is filled with the underfill resin 41b.

Through the method described above, a wiring substrate 210 in which the connection pins 30 are connected to the first substrate 10 and the electronic components 41 to 43 are mounted is obtained.

Figure 9:
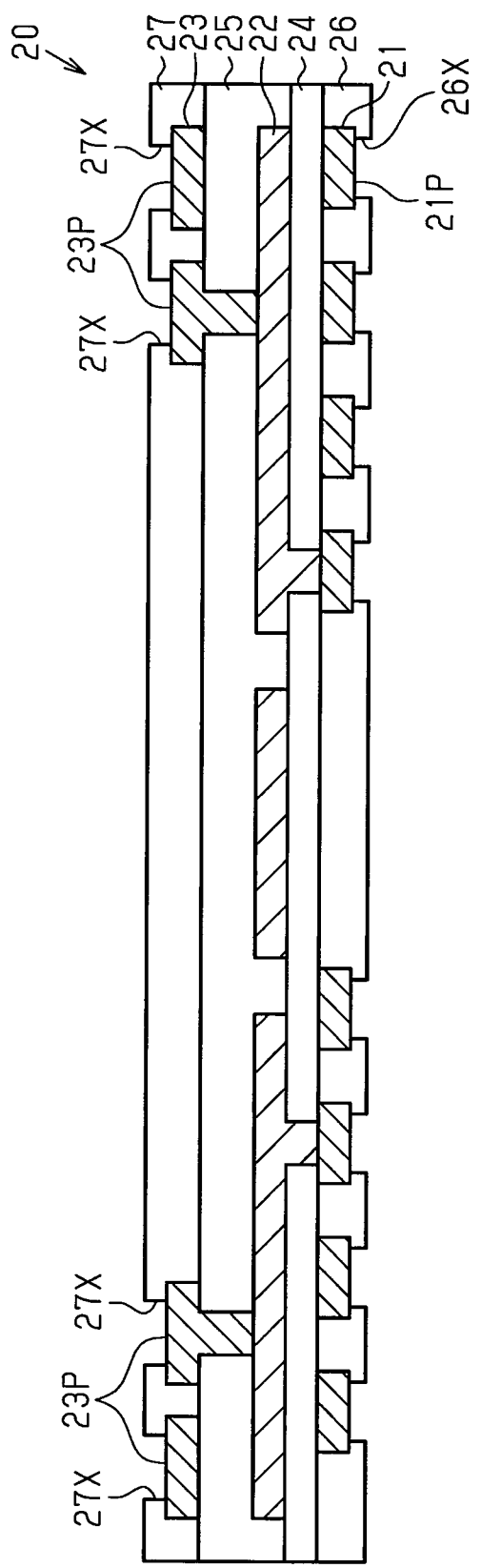

Next, as illustrated in FIG. 9, the second substrate 20 is prepared.

The second substrate 20 may be manufactured by the known method. As described above, the second substrate 20 includes the wiring layers 21, 22, and 23, the insulation layers 24 and 25, and the solder resist layers 26 and 27. The insulation layers 24 and 25 may be obtained, for example, by laminating with resin films under vacuum and curing the resin films with heat. Alternatively, the insulation layers 24 and 25 may be formed by applying a resin paste or a resin liquid and curing the resin with heat. Next, openings are formed in the insulation layers 24 and 25 by the known method. The wiring layers 21 to 23 may be formed, for example, through a semi-additive process. Alternatively, the wiring layers 21 to 23 may be formed by etching a metal foil (for example, copper foil). The solder resist layer 26 may be obtained, for example, by laminating the insulation layer 24 and the wiring layer 21 with a photosensitive solder resist film or applying a liquid solder resist to the insulation layer 24 and the wiring layer 21 and then exposing and developing the resist through photolithography to be patterned into a desired shape. Similarly, the solder resist layer 27 may be obtained, for example, by laminating the insulation layer 25 and the wiring layer 23 with a photosensitive solder resist film or applying a liquid solder resist to the insulation layer 25 and the wiring layer 23 and then exposing and developing the resist through photolithography to be patterned into a desired shape.

Figure 10:
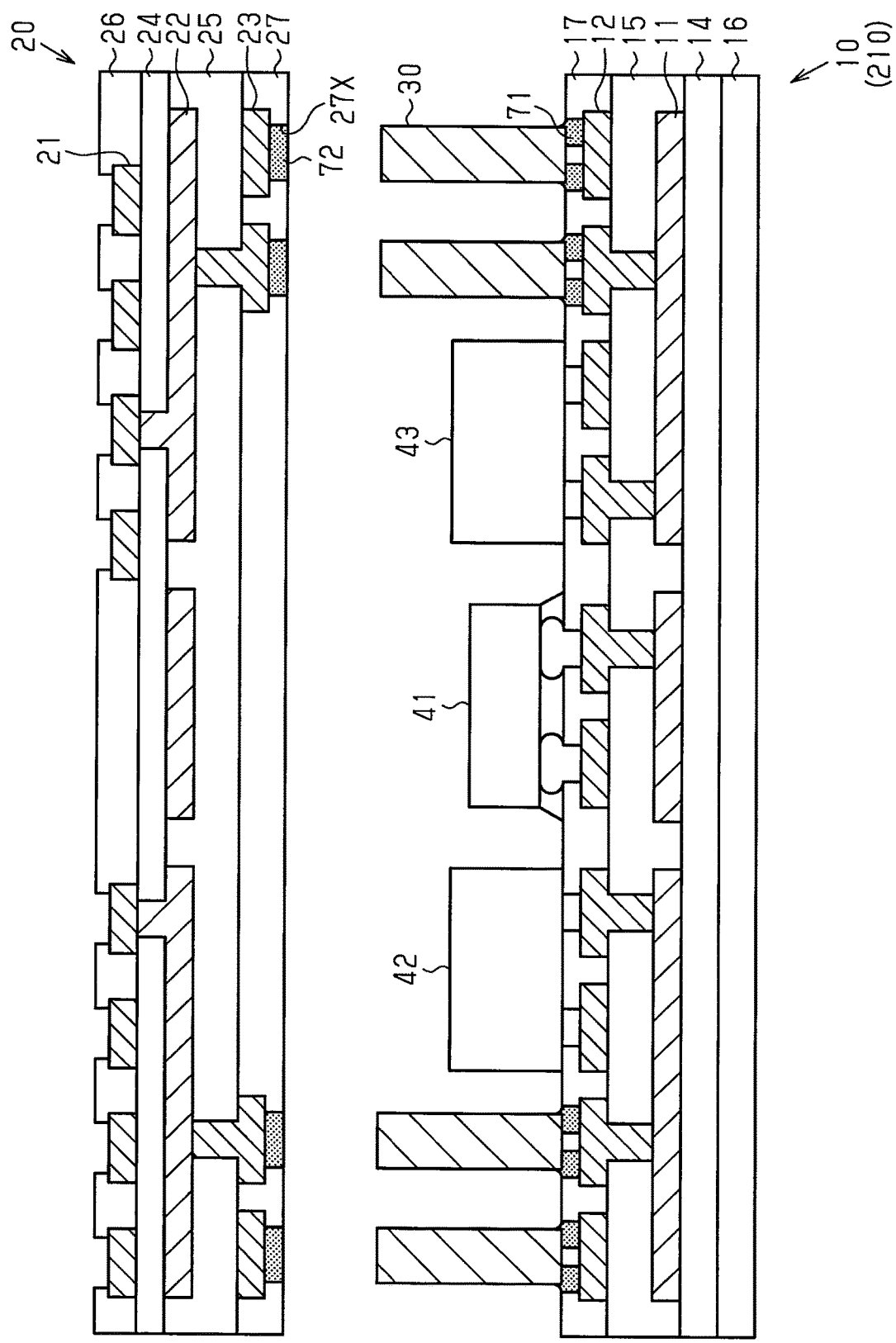

Next, a solder paste 72 is applied to the connection pads 23P of the second substrate 20. Then, as illustrated in FIG. 10, the second substrate 20 is inverted upside down, and the connection pads 23P of the second substrate 20 are aligned with the connection pins 30.

Figure 11:
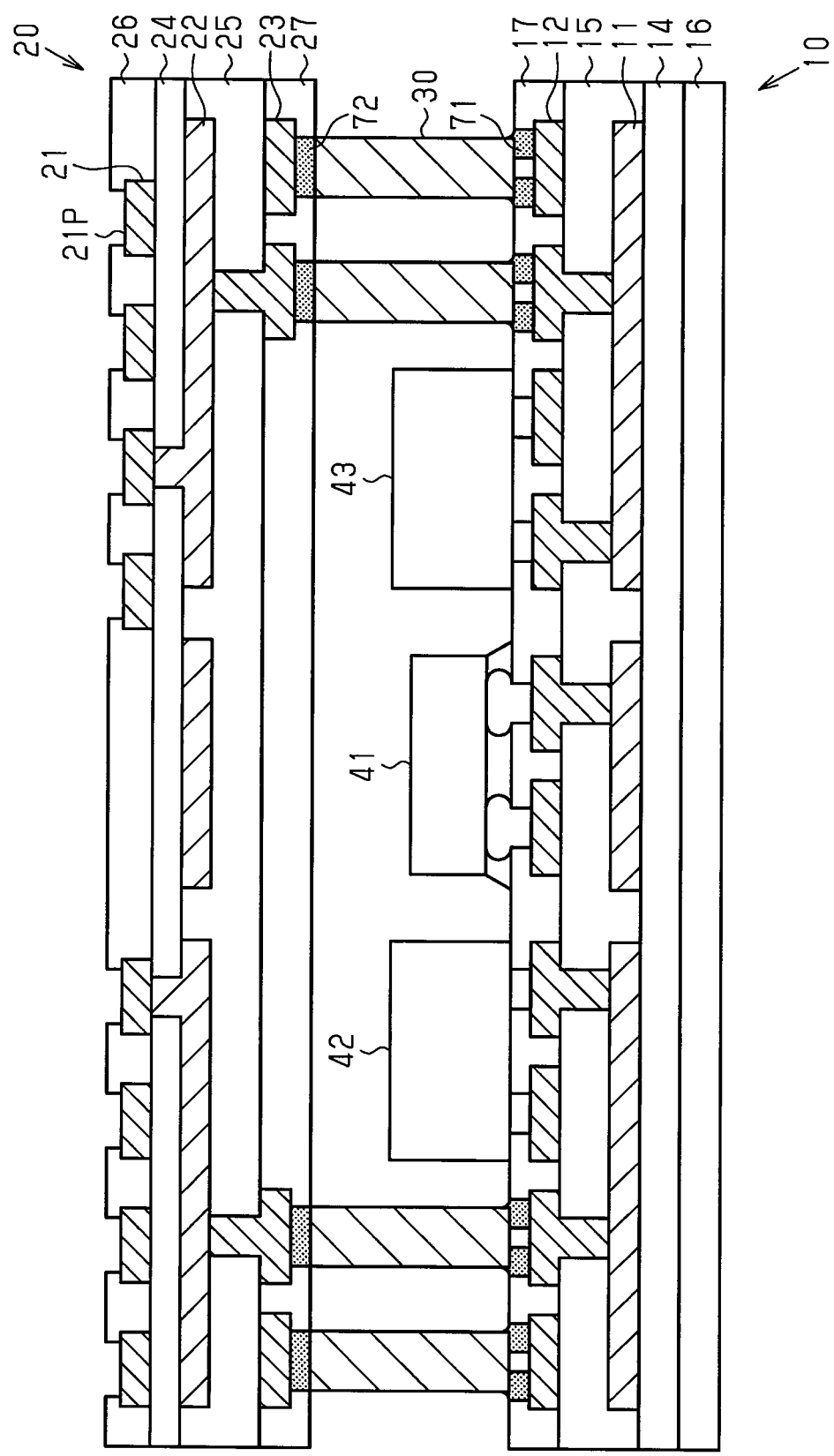

As illustrated in FIG. 11, in a state in which the solder paste 72 of the second substrate 20 is in contact with the upper end surfaces of the connection pins 30, the solder paste 72 is heated through the reflow process. This connects the connection pins 30 to the connection pads 23P of the second substrate 20 with the solder 72.

Figure 12:
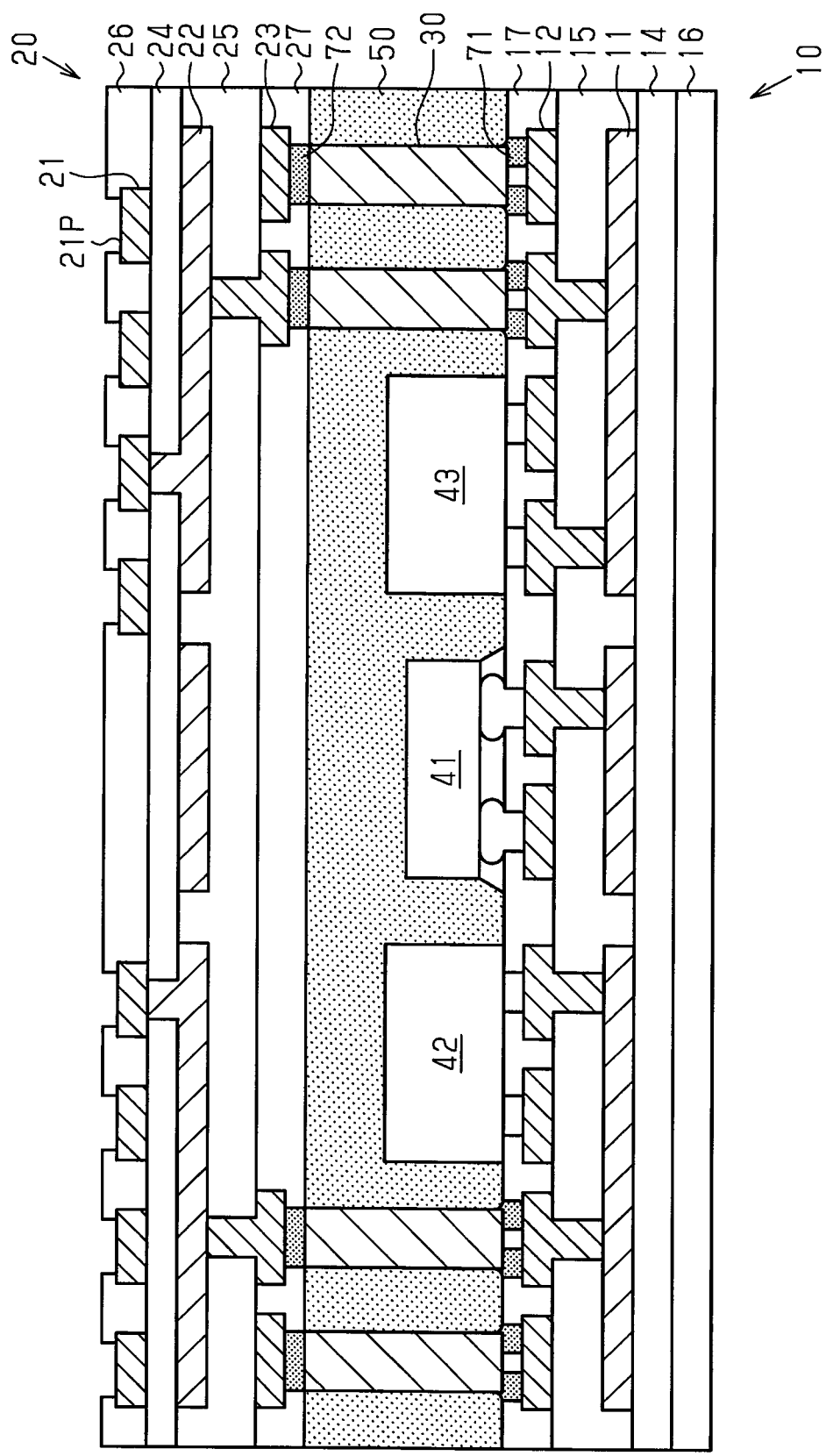

As illustrated in FIG. 12, the gap between the first substrate 10 and the second substrate 20 is filled with the encapsulation resin 50 to encapsulate the connection pins 30 and the electronic components 41 to 43.

Figure 13:
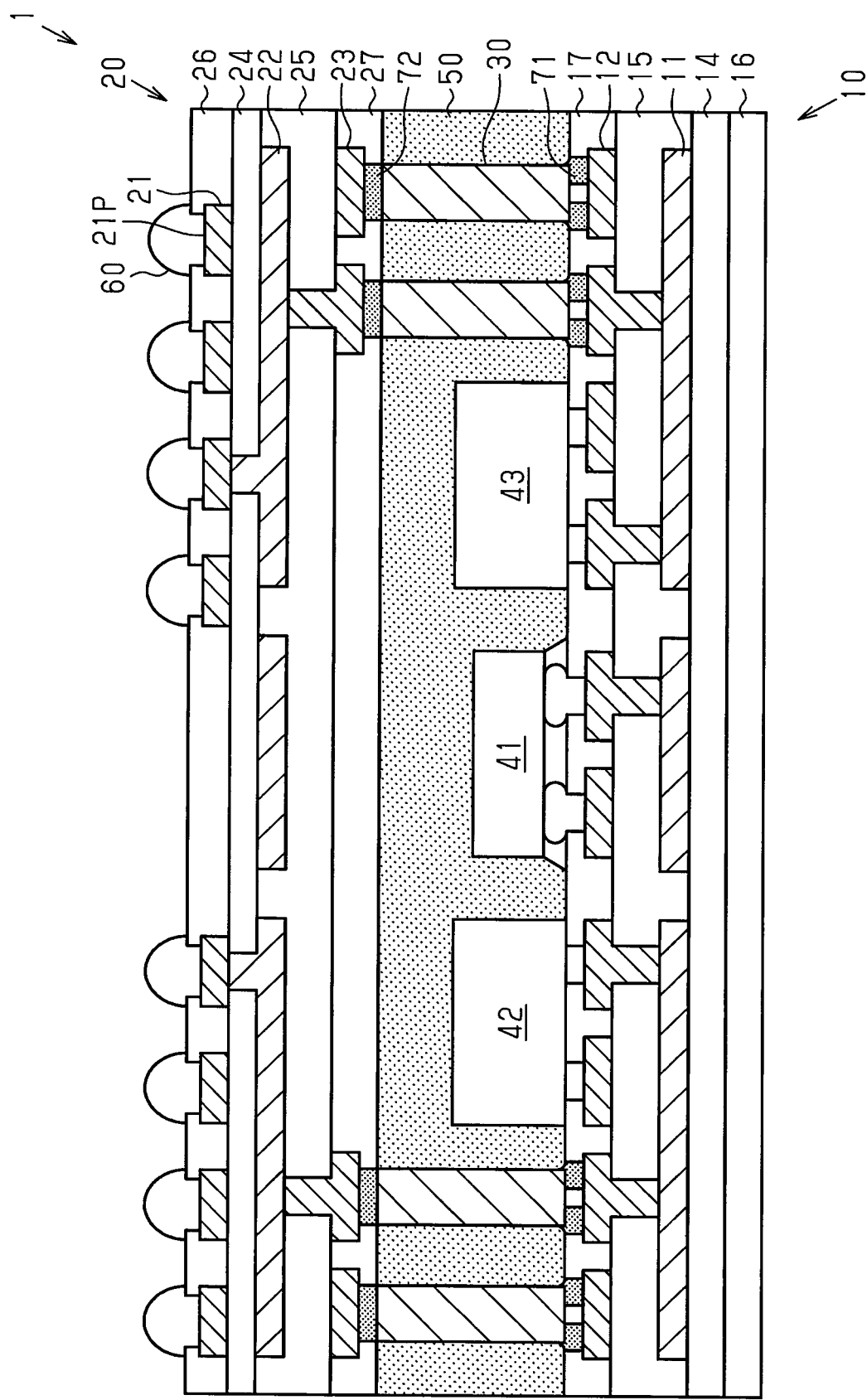

As illustrated in FIG. 13, solder balls or the like are mounted to the external connection pads 21P of the first substrate 10 to form the external connection terminals 60. Through the method described above, the wiring substrate 1 of FIG. 1 is completed.

The first embodiment has the advantages described below.

(1-1) The wiring substrate 1 includes the first substrate 10, the cylindrical connection pins 30, and the solder 71. The first substrate 10 includes the wiring layer 12 and the solder resist layer 17 partially covering the wiring layer 12. The solder resist layer 17 includes the openings 17X, each of which partially exposes the wiring layer 12, and the supports 17S, each of which partially covers the wiring layer 12 within the corresponding one of the openings 17X. The wiring layer 12 includes the connection pads 12P, each of which is exposed in the corresponding opening 17X and formed by the portion of the wiring layer 12 located at the outer side of the corresponding support 17S. The solder 71 bonds the first end portions (end surfaces 30a) of the connection pins 30 and the connection pads 12P located in the openings 17X. In this structure, the supports 17S are in contact with the connection pins 30 and suppress inclination of the connection pins 30. The supports 17S each have the same thickness as that of the covering portions 17C covering the wiring layer 12. Thus, the decrease in the connection reliability of the first substrate 10 and the second substrate 20 and the decrease in the manufacturing yield are suppressed.

(1-2) The inclination of the connection pins 30 is suppressed. This may decrease the pitch between the connection pins 30 and achieve the wiring substrate 1 with high density and high performance.

(1-3) The openings 17X of the solder resist layer 17 each have a larger diameter than each connection pin 30. In this structure, the solder 71 includes the fillet 71F bonded to the side surface 30b of the connection pin 30. The fillet 71F increases the contact area of the connection pin 30 and the solder 71 and thus increases the bonding strength of the connection pin 30 with the solder 71. The fillet 71F of the solder 71 is formed on the side surface 30b of the connection pin 30R that is misaligned. Accordingly, even in the misaligned connection pin 30R, the bonding strength with the solder 71 is sufficiently maintained.

(1-4) The diameter of each of the supports 17S is set so that the shortest distance between the side surface of the support 17S and the wall surface of the opening 17X (that is, inner surface of covering portion 17C) is less than 50% of the diameter of the connection pin 30. If the connection pin 30 is displaced laterally from the edge of the support 17S, inclination of the connection pin 30 may be occurred. In view of this, the diameter of the support 17S is set taking into consideration the shortest distance described above.

This increases the possibility that the connection pin 30 comes into contact with the support 17S. Thus, even if the connection pin 30 is largely misaligned, the support 17S and the covering portion 17C support the connection pin 30 and suppress the inclination of the connection pin 30.

It should be apparent to those skilled in the art that the first embodiment may be implemented in many other specific forms without departing from the scope of this disclosure. Particularly, it should be understood that the first embodiment may be implemented in the following forms.

The number and the shape of the supports 17S may be appropriately changed.

Figure 14A:
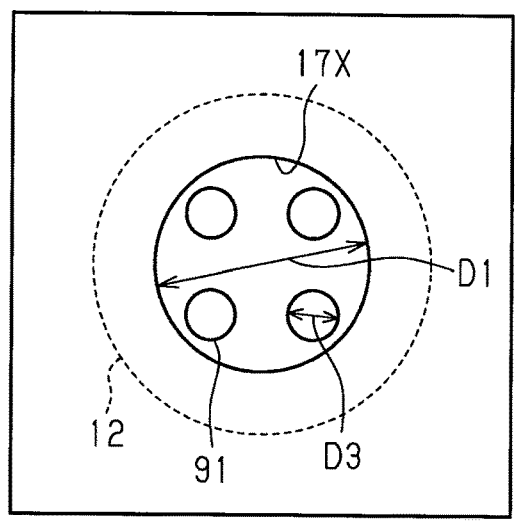
FIGS. 14A to 14C are partially schematic cross-sectional views illustrating various modified examples of the support.

For example, as illustrated in FIG. 14A, four supports 91 may be arranged in the opening 17X. The number of the supports 91 may be two, three, or five or more. The supports 91 each have a diameter D3, which may be appropriately set according to the diameter of the connection pin 30 and the diameter of the opening 17X (refer to FIGS. 1 to 2B).

Figure 14B:
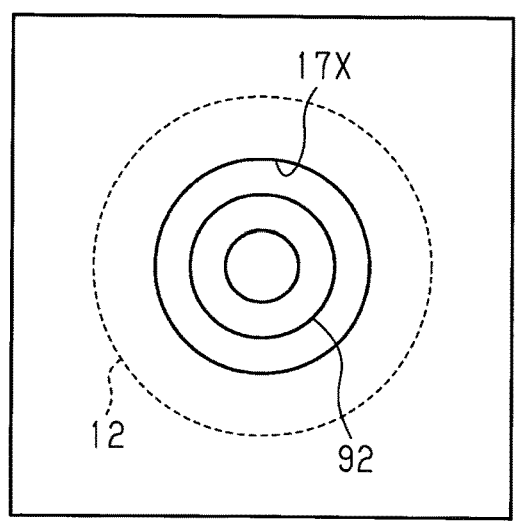

Alternatively, as illustrated in FIG. 14B, an annular or ring-shaped support 92 may be arranged in the opening 17X.

Figure 14C:
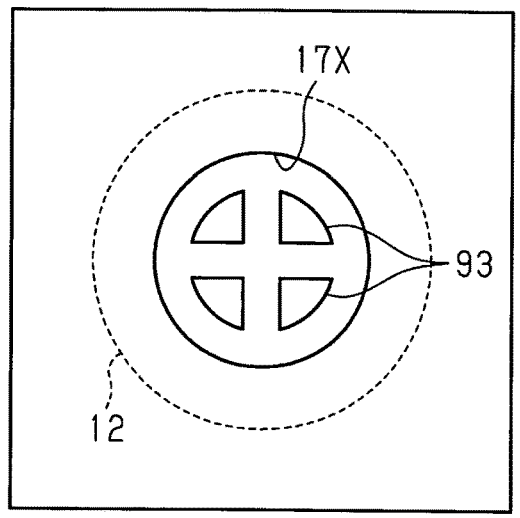

Alternatively, as illustrated in FIG. 14C, for example, fan-shaped supports 93 may be arranged in the opening 17X. In this example, four supports 93 are arranged in the opening 17X. However, the number of the supports 93 is not particularly limited.

The solder resist layer 27 of the second substrate 20 may include support(s) in the same manner as the supports 17S of the solder resist layer 17 of the first substrate 10.

The external connection terminals 60 may be connected to the first substrate 10 of the wiring substrate 1 (electronic device).

The electronic component(s) may be mounted to the second substrate 20 instead of the first substrate 10 or to both of the first and second substrates 10 and 20.

The electronic components 41 to 43 may not be mounted to the first substrate 10.

The electronic components 41 to 43 may be mounted to the upper surface of the first substrate 10 instead of the lower surface of the first substrate 10.

The electronic components 41 to 43 or any other electronic component(s) may be embedded in at least one of the first substrate 10 and the second substrate 20.

The wiring substrate 1 may include only the first substrate 10 together with the connection pins 30 and not include the second substrate 10 and the electronic component(s). Alternatively, the wiring substrate 1 may include only the first and second substrates 10 and 20 together with the connection pins 30 and not include the electronic component(s). Thus, the wiring substrate 1 may be interposer.

The size of each opening 17X may be appropriately changed as long as the bonding strength of the solder 71 (bonding member) and the connection pin 30 is sufficiently obtained. For example, the diameter of the opening 17X may be less than the diameter of the connection pin 30.

Second Embodiment

A wiring substrate 1A according to a second embodiment will now be described with reference to FIGS. 15 to 18. In the following, elements of the second embodiment that differ from those of the first embodiment will be mainly described. In the second embodiment, the same reference characters are given to those elements that are the same or substantially the same as the corresponding elements of the first embodiment. Such elements will not be described in detail.

Figure 15:
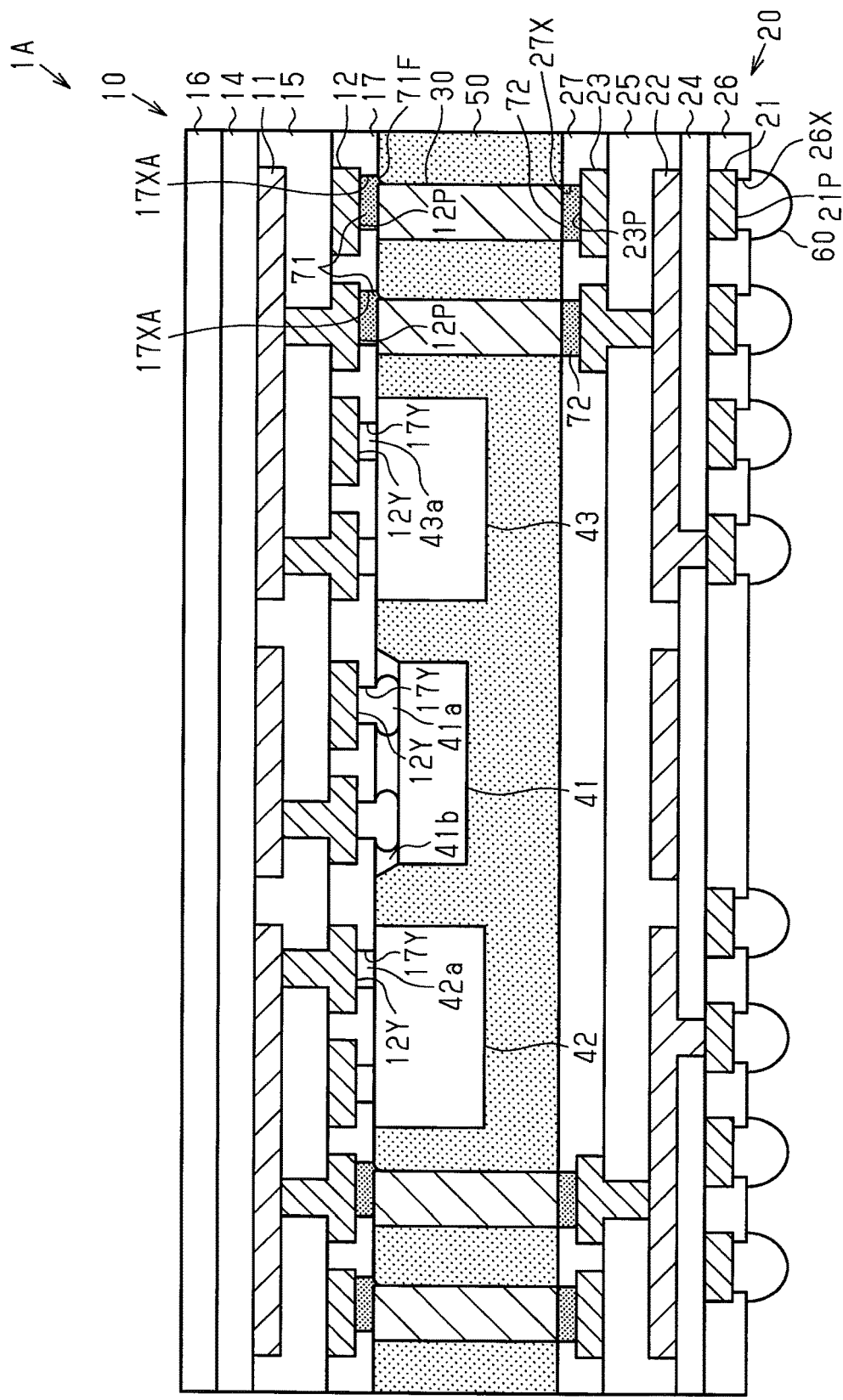
FIG. 15 is a schematic cross-sectional view of a wiring substrate according to a second embodiment.

As illustrated in FIG. 15, the wiring substrate 1A of the second embodiment differs from the wiring substrate 1 of the first embodiment in that the solder resist layer 17 of the first substrate 10 does not include the support (for example, supports 17S or the like) and include openings 17XA instead of openings 17X.

The structure of the opening 17XA will now be described in detail.

Figure 16A:
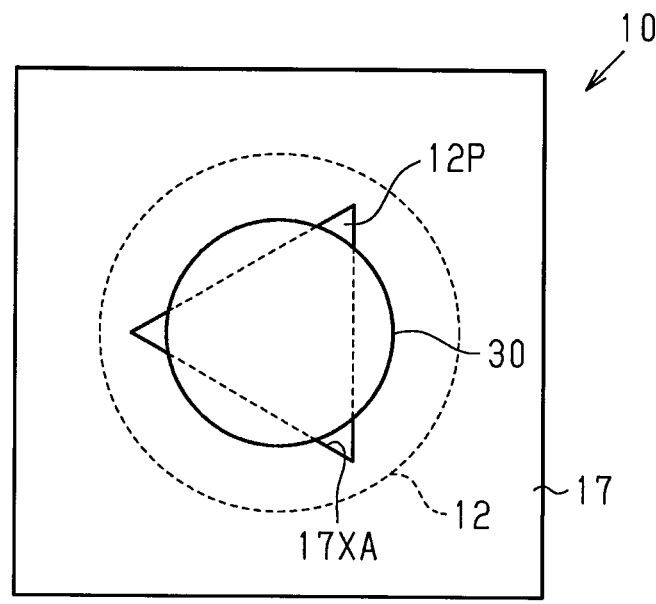
FIG. 16A is a partially schematic plan view illustrating a solder resist layer arranged in the wiring substrate of FIG. 15 and including an opening.

As illustrated in FIG. 16A, the opening 17XA is triangular in a plan view. In the present example, the opening 17XA is equilateral-triangular in a plan view. In the following description, a "triangular" shape includes the shape in which at least one of three vertexes is chamfered or rounded. In this case, the size of the opening 17XA is defined by the length of each side (distance between two adjacent vertexes) of a triangle of which each vertex is an intersection of two sides extending through the chamfered or rounded portion.

Figure 16B:
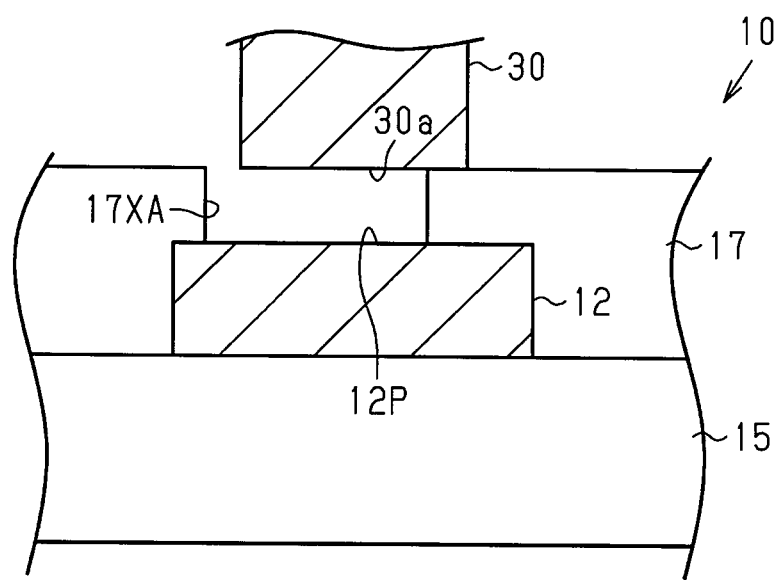
FIG. 16B is a partially schematic cross-sectional view illustrating a connection pin and the solder resist layer covering a wiring layer.

The size of the opening 17XA (i.e., length of each side) is set according to the size of the connection pin 30. For example, as illustrated in FIG. 16A, the size of the opening 17XA is set so that three vertex portions are located outside the outer circumference of the connection pin 30. Additionally, the size of the opening 17XA is set so that each side partially overlaps the first end surface 30a of the connection pin 30. Accordingly, as illustrated in FIGS. 16A and 16B, the connection pin 30 is arranged so that portions of the first end surface 30a overlap the solder resist layer 17 and the remaining portion of the first end surface 30a overlaps the opening 17XA.

Figure 18:
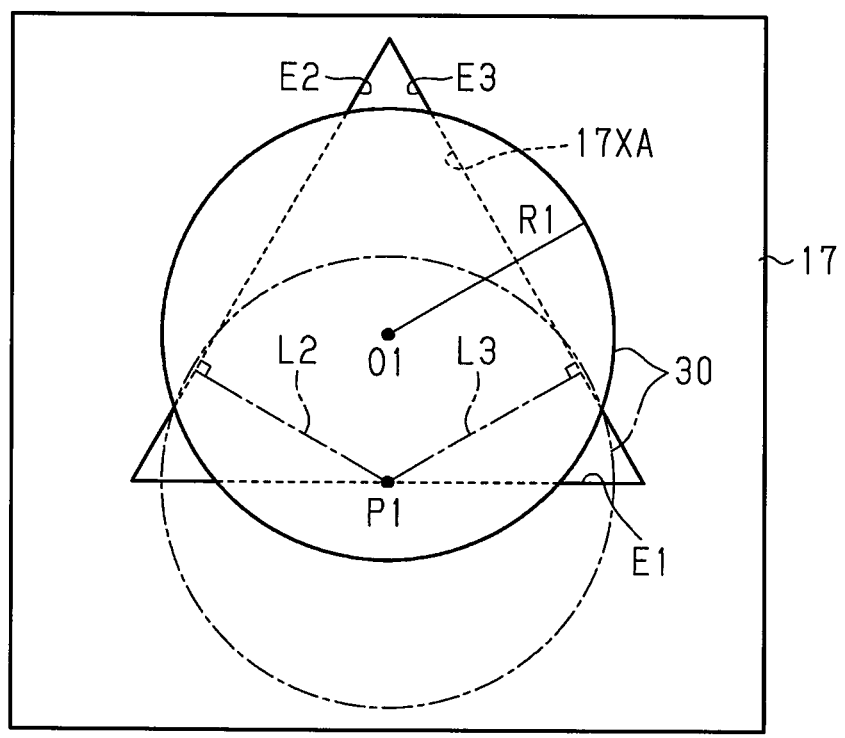
FIG. 18 is a view illustrating the relationship between the opening of the solder resist layer and the connection pin.

As illustrated in FIG. 18, the opening 17XA is defined by three sides E1, E2, and E3. Lines L2 and L3 are perpendicular lines that connect a point P1 on the side E1 and the sides E2 and E3, respectively. The point P1 is, for example, the midpoint of the side E1. In the case where the opening 17XA is equilateral-triangular, the perpendicular lines L2 and L3 have the same length. The size of the opening 17XA is set so that the length of each perpendicular line L2, L3 is shorter than the radius R1 of the connection pin 30. In this case, as illustrated by single-dashed lines in FIG. 18, when a center O1 of the connection pin 30 coincides with the point P1 of the side E1, the outer circumference of the first end surface 30a (refer to FIG. 16B) partially contacts the upper surface of the solder resist layer 17 forming the sides E1, E2, and E3. The size (i.e., length of each side) of the triangular opening 17XA is set in this manner. In FIG. 18, when the center O1 of the connection pin 30 is located below the side E1, more than a half of the first end surface 30a of the connection pin 30 contacts the upper surface of the solder resist layer 17. Thus, even if the connection pin 30 is largely misaligned, inclination of the connection pin 30 is suppressed.

Although FIG. 18 illustrates the example of the equilateral-triangular opening 17XA, the same applies to any other triangular opening of which the sides have different lengths. In such a case, the point P1 is defined as an intersection of a line, which connects the inner center (center of inscribed circle) of the triangular opening 17XA and the vertex where the sides E2 and E3 intersect, and the side E1. Also in this case, the length of the perpendicular line L2 from the point P1 to the side E2 is the same as the length of the perpendicular line L3 from the point P1 to the side E3. The size of the opening 17XA is set so that the length of each side L2, L3 is shorter than the radius R1 of the connection pin 30.

Figure 17A:
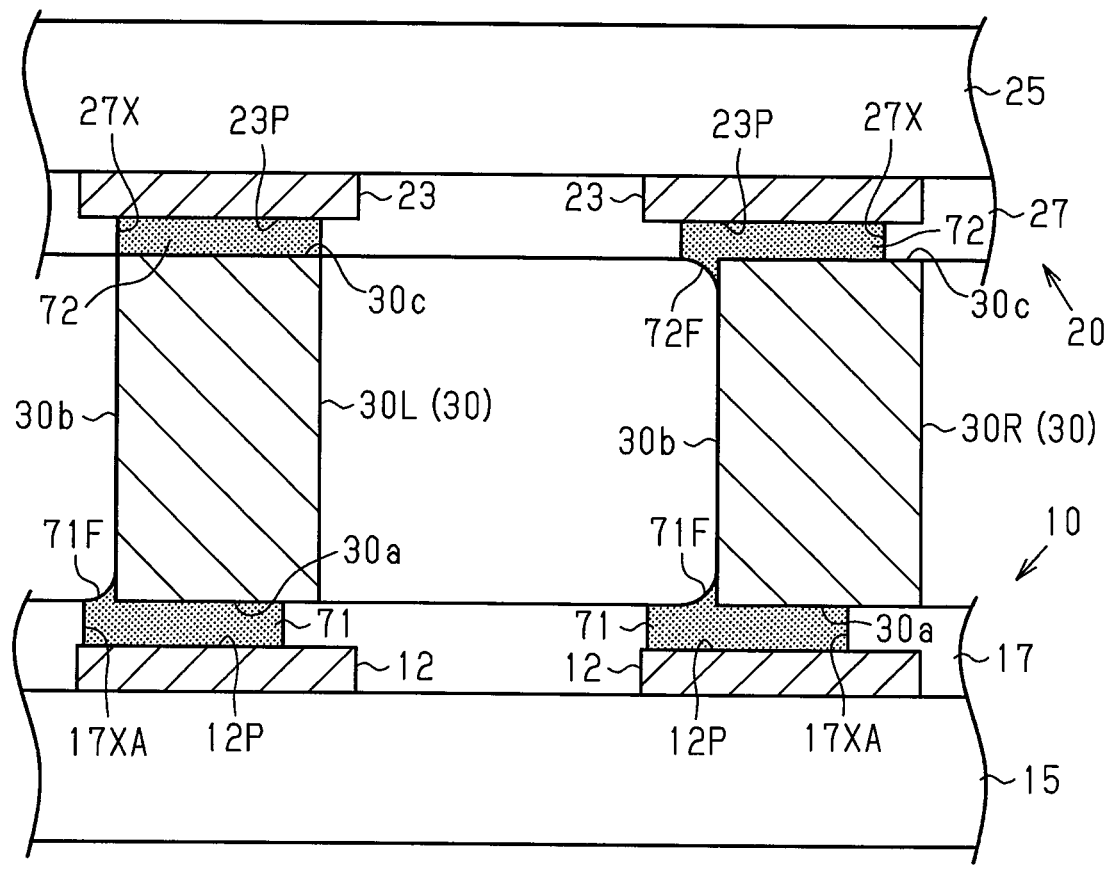
FIG. 17A is a partially schematic cross-sectional view illustrating a connection state of a connection pin that is not misaligned and a connection state of a connection pin that is misaligned.
Figure 17B:
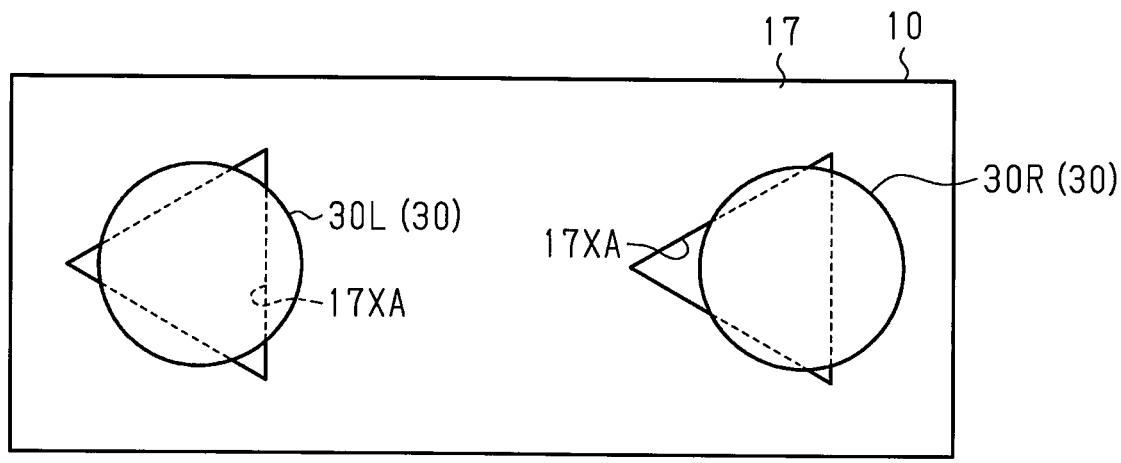
FIG. 17B is a partially schematic plan view of FIG. 17A illustrating the solder resist layer and the connection pins.

FIG. 17A is a partially schematic cross-sectional view illustrating part of the wiring substrate 1A of the second embodiment that is inverted upside down with respect to the structure of FIG. 15. FIG. 17B is a partially schematic plan view of FIG. 17A illustrating the solder resist layer 17 and the connection pins 30.

As illustrated in FIGS. 17A and 17B, the solder resist layer 17 of the first substrate 10 includes the triangular openings 17XA that expose portions of the wiring layer 12 as the connection pads 12P. The connection pins 30 are connected to the connection pads 12P by the solder 71. The triangular openings 17XA allow for the connection pins 30 to contact the upper surface of the solder resist layer 17. Thus, inclination of the connection pins 30 is suppressed.

In FIGS. 17A and 17B, the connection pin 30L (30) that is not misaligned is illustrated on the left side, and the connection pin 30R (30) that is misaligned is illustrated on the right side.

Firstly, the connection pin 30L that is not misaligned will now be described. As illustrated in FIGS. 17A and 17B, the connection pin 30L is located immediately above the opening 17XA of the solder resist layer 17 so that an internal point (for example, centroid) of the triangular opening 17XA coincides with the center O1 of the connection pin 30L. The three vertex portions of the triangular opening 17XA are located outside the outer circumference of the first end surface 30a (refer to FIG. 17A) of the connection pin 30L. Additionally, each side of the triangular opening 17XA partially overlaps the first end surface 30a (refer to FIG. 17A) of the connection pin 30L. Thus, the outer circumference of the first end surface 30a partially contacts the upper surface of the solder resist layer 17 forming the sides E1, E2, and E3 of the triangular opening 17XA.

In the same manner as the first embodiment, the solder 71 bonded to the connection pin 30L includes the fillet 71F bonded to part of the side surface 30b at the first end portion (lower end portion in FIG. 17A) of the connection pin 30L. The fillet 71F increases the contact area of the solder 71 and the connection pin 30L as compared to when only the first end surface 30a of the connection pin 30L is in contact with the solder 71. The increase in the contact area increases the bonding strength of the connection pin 30L with the solder 71.

Next, the connection pin 30R that is misaligned will now be described. As illustrated in FIGS. 17A and 17B, the connection pin 30R is misaligned. Even in this case, when the size of the triangular opening 17XA is set as described above, the first end surface 30a of the connection pin 30R is in contact with the upper surface of the solder resist layer 17 forming the three sides of the triangular opening 17XA. That is, the first end surface 30a of the connection pin 30R is in contact with the upper surface of the solder resist layer 17 at three locations corresponding to the three sides. Thus, the connection pin 30R is not inclined and therefore reliably connected to the connection pad 12P by the solder 71.

In the same manner as the first embodiment, the solder 71 bonded to the connection pin 30R includes the fillet 71F bonded to part of the side surface 30b at the first end portion (lower end portion in FIG. 17A) of the connection pin 30R. The fillet 71F increases the contact area of the solder 71 and the connection pin 30R as compared to when only the first end surface 30a of the connection pin 30R is in contact with the solder 71. The increase in the contact area increases the bonding strength of the connection pin 30R with the solder 71.

The wiring substrate 1A of the second embodiment may be manufactured in the same manner as the method for manufacturing the wiring substrate 1 of the first embodiment described above with reference to FIGS. 5 to 13 except for the formation of the supports 17S in FIG. 6C.

The second embodiment has the advantages described below.

(2-1) The wiring substrate 1A includes the first substrate 10, the cylindrical connection pins 30, and the solder 71. The first substrate 10 includes the connection pads 12P and the solder 71 bonds the connection pins 30 and the connection pads 12P. The first substrate 10 also includes the wiring layer 12 and the solder resist layer 17 partially covering the wiring layer 12. The solder resist layer 17 includes the triangular openings 17XA that expose portions of the wiring layer 12 as the connection pads 12P. The first end portions (end surfaces 30a) of the connection pins 30 are connected to the connection pads 12P by the solder 71 arranged in the openings 17XA. The three vertex portions of the triangular opening 17XA are located outside the outer circumference of the first end surface 30a of the connection pin 30. Thus, the outer circumference of the first end surface 30a partially contacts the upper surface of the solder resist layer 17 forming the sides of the triangular opening 17XA. Accordingly, inclination of the connection pins 30 is suppressed. As a result, the decrease in the connection reliability of the first substrate 10 and the second substrate 20 and the decrease in the manufacturing yield are suppressed.

(2-2) The inclination of the connection pins 30 is suppressed. This may decrease the pitch between the connection pins 30 and achieve the wiring substrate 1A with high density and high performance.

(2-3) The three vertex portions of the triangular opening 17XA are located outside the outer circumference of the first end surface 30a of the connection pin 30. In this structure, the solder 71 includes the fillet 71F bonded to the side surface 30b of the connection pin 30. The fillet 71F increases the contact area of the connection pin 30 and the solder 71 and thus increases the bonding strength of the connection pin 30 with the solder 71. The fillet 71F of the solder 71 is formed on the side surface 30b of the connection pin 30R that is misaligned. Accordingly, even in the misaligned connection pin 30R, the bonding strength with the solder 71 is sufficiently maintained.

(2-4) The size of the triangular opening 17XA is set so that the length of each perpendicular line L2, L3 is shorter than the radius R1 of the connection pin 30. If the connection pin 30 is displaced laterally from the sides of the opening 17XA, inclination of the connection pin 30 may be occurred. In view of this, the size of the triangular opening 17XA is set in the manner described above. This allows for each connection pin 30 to contact the upper surface of the solder resist layer 17 forming the sides E1, E2, and E3 of the triangular opening 17XA. Accordingly, inclination of the connection pins 30 is suppressed.

It should be apparent to those skilled in the art that the second embodiment may be implemented in many other specific forms without departing from the scope of this disclosure. Particularly, it should be understood that the second embodiment may be implemented in the following forms.

The shape of the opening 17XA may be appropriately changed. In addition to equilateral triangle, the shape of the opening 17XA may include isosceles triangle, right triangle, isosceles right triangle, and triangle of which three sides have different lengths.

The orientation of the opening 17XA in a plan view is not limited to the orientation illustrated in FIG. 17B and may be appropriately changed.

The shape of the opening 27X of the solder resist layer 27 of the second substrate 20 may be triangular in the same manner as the opening 17XA of the solder resist layer 17 of the first substrate 10.

For example, a bonding member such as the solder 71 may be arranged between the upper surface of the solder resist layer 17 and the first end surface 30a of the connection pin 30 as long as inclination of the connection pin 30 is suppressed.

The external connection terminals 60 may be connected to the first substrate 10 of the wiring substrate 1A (electronic device).

The electronic component(s) may be mounted to the second substrate 20 instead of the first substrate 10 or to both of the first and second substrates 10 and 20.

The electronic components 41 to 43 may not be mounted to the first substrate 10.

The electronic components 41 to 43 may be mounted to the upper surface of the first substrate 10 instead of the lower surface of the first substrate 10.

The electronic components 41 to 43 or any other electronic component(s) may be embedded in at least one of the first substrate 10 and the second substrate 20.

The wiring substrate 1A may include only the first substrate 10 together with the connection pins 30 and not include the second substrate 10 and the electronic component(s). Alternatively, the wiring substrate 1A may include only the first and second substrates 10 and 20 together with the connection pins 30 and not include the electronic component(s). Thus, the wiring substrate 1A may be interposer.

In the above first and second embodiments and those modified examples, the structures may be partially replaced with the known structure. Further, the above first and second embodiments and those modified examples may be partially or entirely combined with one another or with other modified examples.

Clauses

This disclosure further encompasses the following embodiments.

1. A wiring substrate including:

a first substrate including a wiring layer and a solder resist layer that partially covers the wiring layer, the solder resist layer including an opening that is triangular and exposes a portion of the wiring layer as a first connection pad;

a connection pin that is cylindrical and arranged so that a portion of a first end surface of the connection pin overlaps the solder resist layer in a plan view and so that a remaining portion of the first end surface overlaps the opening in a plan view; and a bonding member that bonds the first end surface of the connection pin and the first connection pad located in the opening.

2. The wiring substrate according to clause 1, wherein the opening includes three vertex portions that are located outside an outer circumference of the first end surface of the connection pin.

3. The wiring substrate according to clause 1, wherein the bonding member includes a fillet bonded to a side surface of the connection pin.

4. The wiring substrate according to clause 1, wherein an outer circumference of the first end surface of the connection pin is in contact with an upper surface of the solder resist layer at three locations corresponding to three sides of the opening.

5. The wiring substrate according to clause 1, further including a second substrate including a second connection pad, wherein the connection pin includes a second end surface connected to the second connection pad.

6. An electronic device including:
a first substrate including a wiring layer and a solder resist layer that partially covers the wiring layer, the solder resist layer including an opening that is triangular and exposes a portion of the wiring layer as a first connection pad;
a second substrate including a second connection pad;
an electronic component mounted to or embedded in at least one of the first substrate and the second substrate;
a connection pin that is cylindrical and arranged between the first substrate and the second substrate, wherein the connection pin is arranged so that a portion of a first end surface of the connection pin overlaps the solder resist layer in a plan view and so that a remaining portion of the first end surface overlaps the opening in a plan view;
a first bonding member that bonds the first end surface of the connection pin and the first connection pad located in the opening;
a second bonding member that bonds a second end surface of the connection pin and the second connection pad; and
an encapsulation resin with which a gap between the first substrate and the second substrate is filled to encapsulate the electronic component and the connection pin.

All examples and conditional language recited herein are intended for pedagogical purposes to aid the reader in understanding the principles of the invention and the concepts contributed by the inventors to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
a first substrate including a wiring layer and a solder resist layer that partially covers the wiring layer, wherein the solder resist layer includes:
a covering portion formed by a portion of the solder resist layer and covering an outer circumference of a surface of the wiring layer;
a support formed by another portion of the solder resist layer and arranged on the surface of the wiring layer exposed from the covering portion; and
an opening that is circular and defined by the covering portion and the support to expose the surface of the wiring layer exposed from the covering portion and the support as a first connection pad;
a connection pin that is cylindrical; and
a bonding member that bonds a first end surface of the connection pin and the first connection pad located in the opening.

2. The wiring substrate according to claim 1, wherein the covering portion defines a wall of the opening and covers an outer circumference of the wiring layer, and the support has a thickness that is the same as a thickness of the covering portion.

3. The wiring substrate according to claim 1, further comprising
a second substrate including a second connection pad, wherein the connection pin includes a second end surface connected to the second connection pad.

4. The wiring substrate according to claim 1, wherein the opening has a diameter that is larger than a diameter of the connection pin, and
the bonding member includes a fillet bonded to a side surface of the connection pin.

5. The wiring substrate according to claim 1, wherein the support is circular in a plan view, and
the support has a diameter that is smaller than a diameter of the connection pin.

6. The wiring substrate according to claim 1, wherein a shortest distance between a side surface of the support and a wall surface of the opening is less than 50% of a diameter of the connection pin.

7. The wiring substrate according to claim 1, wherein the support is one of a plurality of supports arranged in the opening.

8. The wiring substrate according to claim 1, wherein the first end surface of the connection pin is in contact with the support.

9. The wiring substrate according to claim 1, wherein the support is a sole support arranged in the opening.

10. An electronic device comprising:
a first substrate including a wiring layer and a solder resist layer that partially covers the wiring layer, wherein the solder resist layer includes:
a covering portion formed by a portion of the solder resist layer and covering an outer circumference of a surface of the wiring layer;
a support formed by another portion of the solder resist layer and arranged on the surface of the wiring layer exposed from the covering portion; and
an opening that is circular and defined by the covering portion and the support to expose the surface of the wiring layer exposed from the covering portion and the support as a first connection pad;
a second substrate including a second connection pad;
an electronic component mounted to or embedded in at least one of the first substrate and the second substrate;
a connection pin that is cylindrical and arranged between the first substrate and the second substrate;
a first bonding member that bonds a first end surface of the connection pin and the first connection pad located in the opening;
a second bonding member that bonds a second end surface of the connection pin and the second connection pad; and
an encapsulation resin with which a gap between the first substrate and the second substrate is filled to encapsulate the electronic component and the connection pin.

* * * * *